(12) United States Patent
Nishi et al.

(10) Patent No.: US 6,608,665 B1
(45) Date of Patent: Aug. 19, 2003

(54) SCANNING EXPOSURE APPARATUS HAVING ADJUSTABLE ILLUMINATION AREA AND METHODS RELATED THERETO

(75) Inventors: Kenji Nishi, Yokohama (JP); Kazuaki Suzuki, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/523,304

(22) Filed: Mar. 10, 2000

Related U.S. Application Data

(63) Continuation of application No. 09/138,520, filed on Aug. 24, 1998, now abandoned, which is a continuation of application No. 08/962,268, filed on Oct. 31, 1997, now abandoned, which is a continuation of application No. 08/465,179, filed on Jun. 5, 1995, now abandoned, which is a continuation of application No. 08/255,997, filed on Jun. 8, 1994, now abandoned.

(30) Foreign Application Priority Data

Jun. 11, 1993 (JP) .............................. 5-140578
Aug. 31, 1993 (JP) .............................. 5-216569
Sep. 21, 1993 (JP) .............................. 5-234608

(51) Int. Cl.$^7$ .......................... G03B 27/42; G03B 27/72
(52) U.S. Cl. .......................................... 355/53; 355/71
(58) Field of Search .............................. 355/53, 67, 68, 355/71

(56) References Cited

U.S. PATENT DOCUMENTS

| 3,538,828 | A | 11/1970 | Genovese ....................... 95/18 |
| 4,239,379 | A | 12/1980 | Tomita et al. ................. 355/52 |

(List continued on next page.)

FOREIGN PATENT DOCUMENTS

| EP | 0 614 124 | 9/1994 |
| EP | 0 638 847 | 2/1995 |
| GB | 2 126 740 | 3/1984 |
| JP | 53-25790 | 7/1978 |
| JP | 60-232552 | 11/1985 |
| JP | 61-91662 | 5/1986 |
| JP | 61-247025 | 11/1986 |
| JP | 63-33818 | 2/1988 |
| JP | 1-298719 | 12/1989 |
| JP | 4-196513 | 7/1992 |
| JP | 4-225514 | 8/1992 |
| JP | 4-329623 | 11/1992 |
| JP | 5-66550 | 3/1993 |

OTHER PUBLICATIONS

Tracy, David H., "Exposure Dose Control Techniques for Excimer Laser Lithography", *SPIE*, vol. 922 Optical/Laser Microlithography, 1988, pp. 437–443.

*SPIE Optical/Laser Microlithography V*, vol. 1674, Mar., 1992, pp. 741–752.

Patent Abstracts of Japan, vol. 16, No. 526 (E–1286), Oct. 28, 1992 (JP–A–04 196513).

*Primary Examiner*—Fred L Braun
(74) *Attorney, Agent, or Firm*—Miles & Stockbridge P.C.

(57) ABSTRACT

In a projection exposure apparatus for transferring a pattern formed in a transfer area on a mask onto a photosensitive substrate by a scanning exposure system, provision is made of an illuminating optical system for applying illuminating light to the transfer area of the mask through a rectangular aperture in a field stop disposed apart from a plane conjugate with the pattern surface of the mask, and a light intercepting member having an aperture of which the width is variable in the direction of the relative scanning of the mask and the photosensitive substrate for shielding at least a part of an illumination area on the mask which is defined by the rectangular aperture in the field stop from the light, and provision is further made of a member for driving the light intercepting member so as to change the width of the aperture therein in operative association with a change in the position of the illumination area on the transfer area of the mask which is changed by the relative scanning.

50 Claims, 13 Drawing Sheets

U.S. PATENT DOCUMENTS

| | | | | |
|---|---|---|---|---|
| 4,668,077 A | * | 5/1987 | Tanaka | 355/53 X |
| 4,682,885 A | | 7/1987 | Torigoe | 355/67 |
| 4,688,932 A | * | 8/1987 | Suzuki | 355/51 |
| 4,734,745 A | * | 3/1988 | Ohta | 355/45 |
| 4,747,678 A | | 5/1988 | Shafer et al. | 350/505 |
| 4,780,616 A | | 10/1988 | Nishi et al. | 250/548 |
| 4,780,747 A | * | 10/1988 | Suzuki et al. | 355/53 X |
| 4,822,975 A | * | 4/1989 | Torigoe | 219/121.85 |
| 4,864,360 A | | 9/1989 | Isohata et al. | 355/53 |
| 4,924,257 A | | 5/1990 | Jain | 355/53 |
| 4,939,630 A | * | 7/1990 | Kikuchi et al. | 355/67 X |
| 4,962,318 A | | 10/1990 | Nishi | 250/548 |
| 5,119,113 A | * | 6/1992 | Prakash et al. | |
| 5,184,196 A | * | 2/1993 | Nakagawa et al. | 355/53 X |
| 5,194,893 A | | 3/1993 | Nishi | 355/53 |
| 5,285,236 A | * | 2/1994 | Jain | 355/53 |
| 5,291,240 A | * | 3/1994 | Jain | 355/53 |
| 5,305,054 A | * | 4/1994 | Suzuki et al. | 355/53 |
| 5,335,044 A | * | 8/1994 | Shiraishi | 355/53 |
| 5,379,090 A | * | 1/1995 | Shiraishi | 355/67 |
| 5,473,410 A | * | 12/1995 | Nishi | 355/53 |
| 5,546,225 A | | 8/1996 | Shiraishi | 359/559 |

* cited by examiner

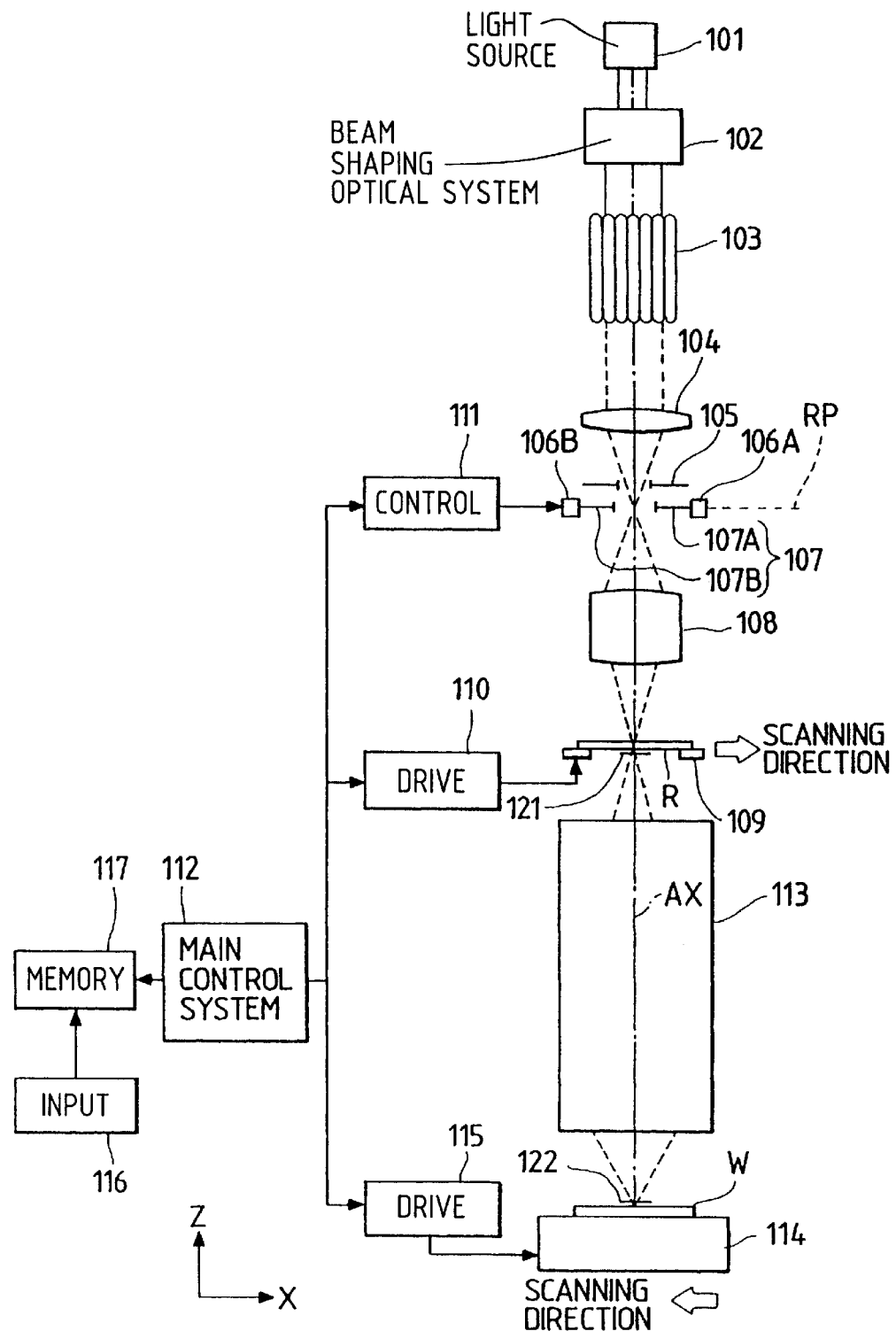

FIG. 11C

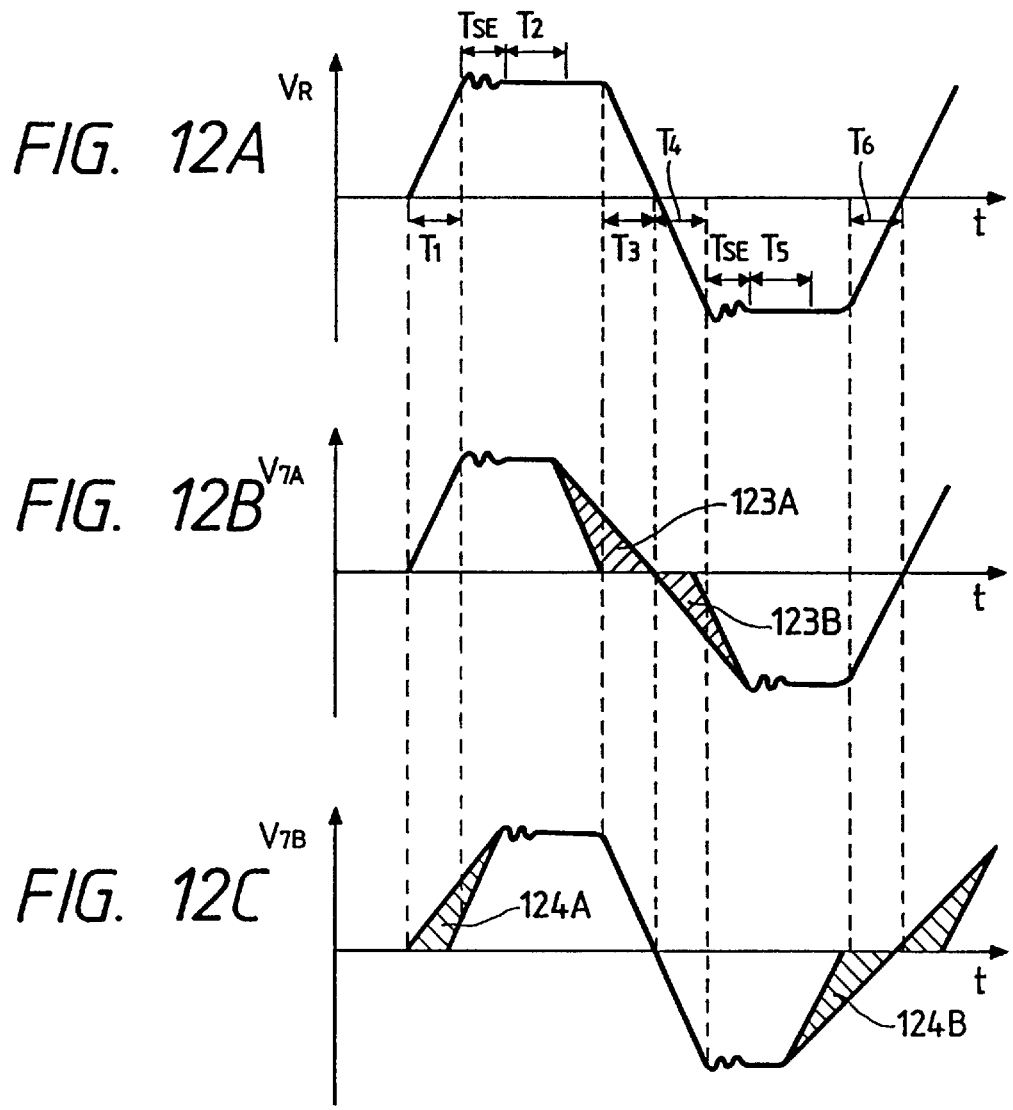

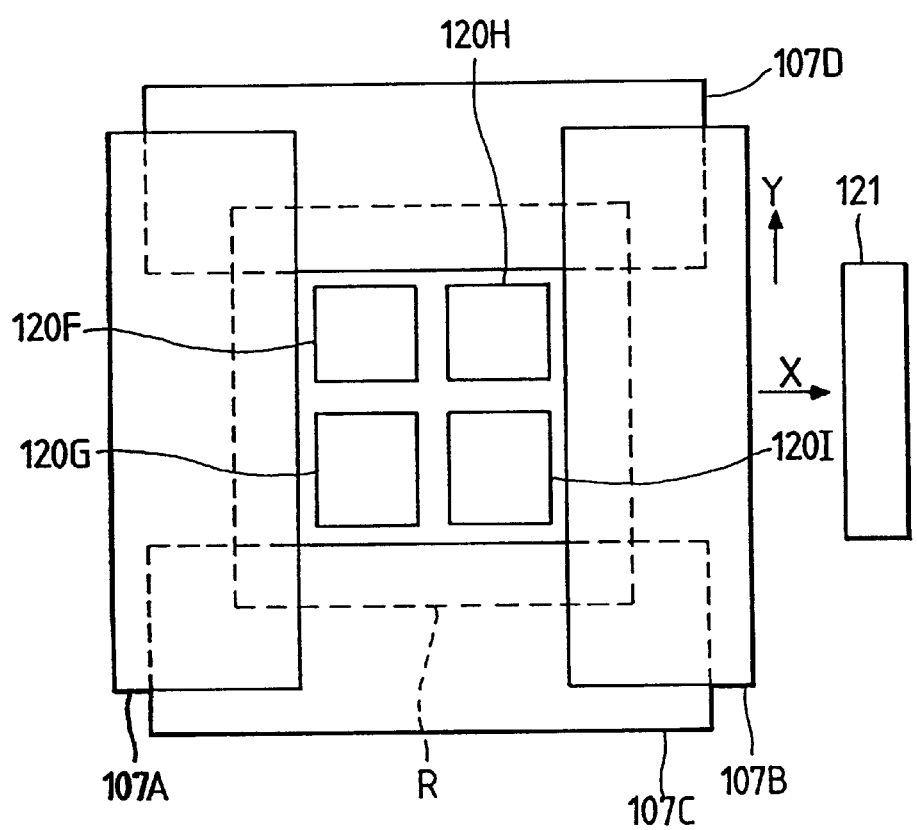

SCANNING EXPOSURE APPARATUS HAVING ADJUSTABLE ILLUMINATION AREA AND METHODS RELATED THERETO

CROSS-REFERENCE TO RELATED APPLICATIONS

This application is a continuation of application Ser. No. 09/138,520 filed Aug. 24, 1998, now abandoned, which is a continuation of application Ser. No. 08/962,268 filed Oct. 31, 1997, now abandoned, which is a continuation of application Ser. No. 08/465,179 filed Jun. 5, 1995, now abandoned, which is a continuation of application Ser. No. 08/255,997 filed Jun. 8, 1994 now abandoned.

BACKGROUND OF THE INVENTION

1. Field of the Invention

This invention relates to an exposure apparatus used in the lithography process for manufacturing, for example, semiconductor devices, liquid crystal display devices, thin film magnetic heads or the like, and particularly to a scanning exposure apparatus in which a mask (or a reticle) and a photosensitive substrate are moved in synchronisn with each other to thereby expose the pattern of the mask on the photosensitive substrate.

2. Related Background Art

Now, in the photolithography process for the manufacture of semiconductor devices, use is made of a projection exposure apparatus in which the pattern of a mask or a reticle (hereinafter generically referred to as the reticle) is transferred onto a semiconductor wafer having a photosensitive material (photoresist) applied thereto through a projection optical system. Recently, in order to meet the tendency of semiconductor devices toward bulkiness and minuteness, it has been desired to accomplish the enlargement of the image field of the projection optical system and an improvement in resolution. However, it is very difficult in design and manufacture to realize both of the higher resolution and wider field of the projection optical system. So, attention has been paid to a scanning type exposure apparatus in which, as disclosed, for example, in U.S. Pat. Nos. 4,747,678, 4,924,257 and 5,194,893, only a localized area on a reticle is illuminated and the reticle and a wafer are moved in synchronism with each other to thereby transfer the pattern of the reticle onto the wafer. The scanning type exposure apparatus, even if the image field of the projection optical system thereof is small, can transfer a pattern image of a large area onto the wafer and moreover can improve the resolution of the projection optical system relatively easily.

Now, in the scanning type exposure apparatus, the reticle is scanned relative to an illumination area defined by a field stop (reticle blind). Accordingly, during the start and termination of the scanning, even the outside of the pattern area on the reticle is illuminated and therefore, an unnecessary pattern may be transferred onto the wafer. To prevent the transfer of the unnecessary pattern, it would occur to mind to increase the width of a light intercepting zone which defines the pattern area, but in such case, the area of the pattern area on the reticle would become small, and this is against the desire to make the area of the transfer pattern large. Also, in a case where only one of two circuit patterns on the reticle is scanned and exposed on the wafer, a part of the other circuit pattern will be transferred onto the wafer if the width of a light intercepting zone partitioning the two circuit patterns is smaller than the width of the illumination area.

So, for example, in Japanese Patent Application Laid-Open No. 4-196513 (U.S. Ser. No. 068,101 filed on May 28, 1993), it is proposed to make each blade (light intercepting plate) of a field stop defining an illumination area on a reticle movable, drive the blades at the start and end of scanning and vary the rectangular aperture in the field stop, i.e., the width of the illumination area on the reticle in the scanning direction, thereby preventing an unnecessary pattern from being illuminated. However, in the scanning type exposure apparatus, to obtain good illuminance uniformity on the wafer (in other words, to effect highly accurate control of exposure amount), the width of the illumination area in the scanning direction must be uniform. Accordingly, it is required of the field stop that there be little unevenness in edge portions perpendicular to the scanning direction and that the two edge portions be movement-controlled while being kept sufficiently parallel to each other when the width in the scanning direction is varied. However, the edge portions of the field stop are formed by something like mechanical knife edges. That is, mechanical knife edges have the inconvenience that the shape error thereof is great and the uniformity of illuminance is reduced. Also, in movement-controlling the aforedescribed field stop in synchronism with the scanning of the reticle, it is difficult to satisfy the accuracy required of parallelism. To satisfy this, a highly accurate positioning mechanism will become necessary, and this leads to the inconvenience that the varying mechanism will become very much complicated.

Also, in a scanning type exposure apparatus using a pulse light source, it is proposed to make the intensity of light on a wafer in the scanning direction into a substantially isosceles trapezoidal shape as disclosed, for example, in U.S. Pat. No. 4,822,975, in order to reduce the irregularity of the exposure amount on the wafer.

SUMMARY OF THE INVENTION

It is the object of the present invention to provide a scanning type exposure apparatus in which good illuminance uniformity (exposure amount control accuracy) is obtained and which can transfer only a desired pattern on a mask onto a photosensitive substrate.

A first scanning type exposure apparatus according to the present invention has a light source generating illuminating light, an illuminating optical system for illuminating an illumination area on a mask by the illuminating light, and a projection optical system for projecting the image of a pattern in the illumination area onto a substrate, and the mask is scanned in a predetermined direction relative to the illumination area and the substrate is scanned in a predetermined direction relative to an exposure area conjugate with the illumination area with respect to the projection optical system, whereby the image of the pattern of the mask is scanned and exposed on the substrate. A fixed field stop for setting the illumination area on the mask to a predetermined shape and a predetermined size, and a light intercepting member for variably limiting the range of the illuminated area set on the mask by the field stop with respect to the predetermined direction are disposed on or near a plane in the illuminating optical system which is conjugate with the pattern surface of the mask. Also, the shape of the illumination area set on the mask by the field stop may preferably be set to a shape conforming to an integrated exposure amount distribution with respect to a direction perpendicular to the predetermined direction on the substrate. Further, it is preferable that the field stop be formed by coating the light-transmitting substrate with light intercepting film and the surface coated with the light intercepting film be installed at a position defocused by a predetermined amount from the plane conjugate with the pattern surface of the mask.

According to the first scanning type exposure apparatus of the present invention, immediately after the start, and immediately before the termination, of the synchronized scanning of the mask and the substrate, a part of the illumination area set on the mask by the fixed field stop protrudes outwardly of a light intercepting zone on the mask which defines the pattern area. So, the light intercepting member provided discretely from the fixed field stop is moved in synchronism with the scanning of the mask, whereby the edge portion of the projected image of the light intercepting member onto the mask is set in the light intercepting zone of the mask. Thereby, a void pattern outside the light intercepting zone is prevented from being exposed on the substrate, in other words, a part thereof is prevented from being sensitized by light passing the outside of the light intercepting zone onto the substrate. Also, when the whole of the illumination area is present in the pattern area on the mask, the illumination area has its shape and size set by the fixed field stop. Accordingly, the position control accuracy of the light intercepting member may be approximately the width of the light intercepting zone on the mask. As described above, the fixed field stop for determining the integrated exposure amount on the substrate and the light intercepting member for limiting the illumination area on the mask are disposed separately from each other and therefore, the positioning accuracy of the light intercepting member may be rougher than in the apparatus of the conventional follow-up type, and the structure of a moving mechanism therefore and a control system can be simplified and the set accuracy of the shape and size of the illuminated area by the fixed field stop can be made higher.

Also, where the shape of the aperture in the field stop is rectangular, if scanning exposure is effected with the mask and the substrate moved in Y-direction, the distribution of the integrated exposure amount E(X) on the substrate with respect to the non-scanning direction (X-direction) perpendicular to the scanning direction (Y-direction) may sometimes be not uniform as shown in FIG. 5C of the accompanying drawings. So, as shown, for example, in FIG. 6A of the accompanying drawings, the shape of the aperture in the field stop is modified in conformity with the integrated exposure amount E(X) of FIG. 5C. Thereby, the distribution of the integrated exposure amount E(X) on the substrate in the non-scanning direction can be uniformized.

Further, where the fixed field stop is formed by coating the light transmitting substrate within the predetermined range thereof with light intercepting film, the aperture as shown, for example, in FIG. 6A can be formed highly accurately and the irregularity of the integrated exposure amount becomes small. Also, where the surface coated with the light intercepting film is installed at a position defocused by a predetermined amount from a plane conjugate with the pattern surface of the mask, the image of a foreign substance (dust or the like) adhering to the light transmitting substrate is blurredly projected onto the substrate and therefore, the foreign substance does not affect the irregularity of the integrated exposure amount on the substrate.

A second scanning type exposure apparatus according to the present invention is provided with an illuminating optical system for illuminating an illumination area on a mask, and a relative scanning member for scanning the mask and a photosensitive substrate in synchronism with each other, and has a fixed field stop disposed on a first mounting surface of a group of mounting surfaces comprising a surface near the pattern-formed surface of the mask, a surface in the illuminating optical system which is conjugate with the pattern-formed surface and a surface near the conjugate surface for setting the width of the illumination area on the mask in the scanning direction. The second apparatus is further provided with a movable field stop disposed on a second mounting surface differing from the first mounting surface of the group of mounting surfaces for setting a variable exposure area to be actually exposed on the photosensitive substrate in the illumination area on the mask, the movable field stop has a first vane and a second vane for setting fore and rear edge portions, respectively, relative to the scanning direction of the exposure area, and at the start of the exposure of the pattern of the mask, the first vane of the movable field stop is driven to move the fore edge portion relative to the scanning direction of the exposure area in synchronism in the scanning direction relative to the illumination area, and at the end of the exposure of the pattern of the mask, the second vane of the movable field stop is driven to move the rear edge portion relative to the scanning direction of the exposure area in synchronism in the scanning direction relative to the illumination area.

A third scanning type exposure apparatus according to the present invention is provided with a light source generating illuminating light, an illuminating optical system for illuminating an illumination area on a mask by the illuminating light, a projection optical system for projecting the image of a pattern in the illumination area onto a photosensitive substrate, and a relative scanning member for scanning the mask and the photosensitive substrate in synchronism with each other relative to the illumination area, and has a fixed field stop disposed on a first mounting surface spaced apart by $\Delta z$ in the direction of the optical axis thereof from a surface conjugate with the pattern-formed surface of the mask for setting the width of the illumination area on the mask in the scanning direction. The third apparatus is further provided with a movable field stop disposed on a second mounting surface substantially coincident with the surface conjugate with the pattern-formed surface of the mask for setting a variable exposure area to be actually exposed on the photosensitive substrate in the illumination area on the mask, and when the numerical aperture of the photosensitive substrate side of the projection optical system is $NA_W$ and the coherence factor of the illuminating light from the illuminating optical system is $\sigma$ and the projection magnification of the projection optical system is $M_{RW}$ and the magnification of the optical system between the surface conjugate with the pattern-formed surface of the mask near the first mounting surface and the pattern-formed surface is $M_{BR}$ and the allowable minimum value of the radius of the blur, on the photosensitive substrate, of the light emitted from a point on the surface on which the fixed field stop is disposed is $\Delta D\text{min}$, $\Delta z$ which is the defocus amount of the first mounting surface, the following condition is satisfied:

$$|\Delta z| \geq \Delta D\text{min}/[M_{BR} \cdot M_{RW} \cdot \tan\{\text{arc } \sin(M_{BR} \cdot M_{RW} \cdot NA_W \cdot \sigma)\}] \quad (1)$$

According to the second scanning type exposure apparatus, the field stop for determining the width of the illumination area in the scanning direction is fixed and therefore, manufacture or adjustment can be done precisely so that the edge portions in the scanning direction may become sufficiently parallel to each other. Also, provision is made of the movable field stop having the first vane and the second vane for determining the variable exposure area which may be rougher in shape accuracy than the illumination area. So, when for example, only one of a plurality of pattern areas on the mask is to be transferred onto the photosensitive substrate, the first vane is driven at the start of scanning exposure to move the fore edge portion of the exposure area relative to the scanning direction in the scanning direction relative to the illumination area, and at the end of scanning exposure, the second vane is driven to move the rear edge portion of the exposure area in the scanning direction relative to the illumination area.

Thereby, only a desired pattern area is transferred onto the photosensitive substrate. In this case, the interval between the first vane and the second vane may be, at greatest, of such a degree that it slightly exceeds the width of the area conjugate with the illumination area. Moreover, the movement strokes of the first and second vanes may be of such a degree that slightly exceeds the width of the area conjugate with the illumination area. Therefore, the movable field stop may be small. Further, the width of the light intercepting portion which partitions the plurality of pattern areas on the mask can be made smaller than the width of the illumination area in the scanning direction, and the area of the pattern areas on the mask can be secured widely. Also, the fixed field stop can be disposed in deviated relationship with the surface conjugate with the pattern-formed surface of the mask and therefore, spatial compatibility can be obtained even when the movable field stop for determining the variable exposure area is disposed, for example, on a plane substantially conjugate with the pattern-formed surface of the mask.

Also, according to the third scanning type exposure apparatus of the present invention, use is made of the fixed field stop and therefore, manufacture or adjustment can be done precisely so that the edge portions of the slit-shaped illumination area in the scanning direction may become sufficiently parallel to each other. Further, use is also made of the movable field stop and therefore, only a desired circuit pattern can be transferred onto the photosensitive substrate even when the width of the light intercepting portion which partitions a plurality of circuit patterns on the mask is small. Also, the movable field stop is disposed on a plane substantially conjugate with the pattern-formed surface of the mask, and the fixed field stop is disposed while being deviated from the conjugate plane by the interval $\Delta z$ which satisfies the aforementioned conditional expression (1). Therefore, as shown in FIG. 6B of the accompanying drawings, predetermined slopes can be given to the both ends of the illuminance distribution of the illumination area in the scanning direction. This is convenient in controlling the exposure amount and in maintaining the uniformity of illuminance when the exposure light source is particularly a pulse light source such as an excimer laser.

BRIEF DESCRIPTION OF THE DRAWINGS

FIG. 10 schematically shows the construction of a scanning exposure apparatus according to a third embodiment of the present invention.

FIGS. 11A to 11F are views used to illustrate an example of the scanning exposing operation of the third embodiment.

FIGS. 12A to 12C show the relations of movement velocity between a reticle and the vanes of a movable blind corresponding to the scanning exposing operation of FIGS. 11A to 11F.

FIG. 14 shows a case where the number of the vanes of the movable blind is four.

DETAILED DESCRIPTION OF THE PREFERRED EMBODIMENTS

Figure 1:
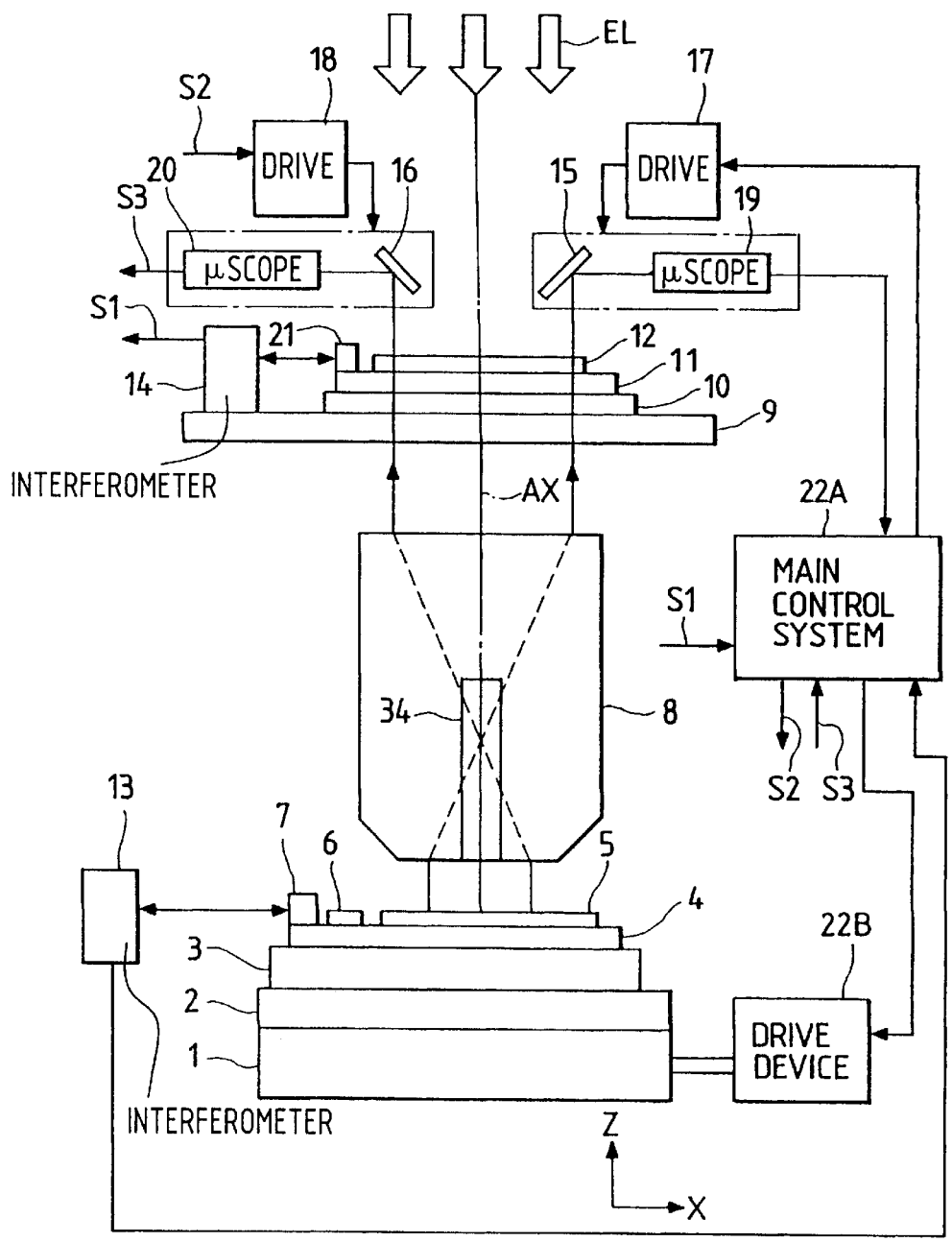
FIG. 1 schematically shows the construction of a scanning exposure apparatus according to a first embodiment of the present invention.

A first embodiment of the present invention will hereinafter be described with reference to FIGS. 1 to 4. FIG. 1 shows the construction of a scanning type exposure apparatus according to the present embodiment. In FIG. 1, exposure light EL from an illuminating optical system, not shown, is applied to only a localized elongate rectangular area on a reticle 12. The exposure light EL passed through the reticle 12 enters a projection optical system 8, which projects the image of the pattern of the reticle 12 onto a wafer 5 having photoresist applied thereto. During scanning exposure, the reticle 12 is scanned at a predetermined velocity V in a forward direction perpendicular to the plane of the drawing sheet of FIG. 1, relative to the illuminating area of the exposure light EL, and in synchronism therewith, the wafer 5 is scanned at a predetermined velocity V/M (1/M being the projecting magnification of the projection optical system 8) in a backward direction perpendicular to the plane of the drawing sheet of FIG. 1.

A drive system for the reticle 12 and wafer 5 will now be described. A coarse movement stage 10 movable only in Y-direction (a direction perpendicular to the plane of the drawing sheet of FIG. 1) is placed on a support bed 9, and a fine movement stage 11 is placed on the coarse movement stage 10, and the reticle 12 is held on the fine movement stage 11 with a vacuum chuck or the like interposed therebetween. The fine movement stage 11 is finely movable in X- and Y-directions and the direction of rotation (θ-direction) in a plane perpendicular to the optical axis AX of the projection optical system 8, and effects the highly accurate position control of the reticle 12. A movable mirror 21 is disposed on one end portion of the fine movement stage 11, and the positions of the fine movement stage 11 in X-, Y- and θ-directions are normally monitored by a laser interferometer 14 disposed on the support bed 9. Positional information S1 from the interferometer 14 is supplied to a main control system 22A.

On the other hand, a Y stage 2 movable in Y-direction is placed on a support bed (base) 1, and an X stage 3 movable in X-direction is placed thereon. Further, a ZL stage 4 finely movable in the direction of the optical axis AX and arbitrarily inclinable with respect to a plane perpendicular to the optical axis AX is provided on the X stage 3, and the wafer 5 is held on the ZL stage 4 with a vacuum chuck (θ table) interposed therebetween. A movable mirror 7 is fixed on the ZL stage 4, and the positions of the ZL stage 4 in X-, Y- and θ-directions are monitored by an interferometer 13 disposed outside. Positional information from the interferometer 13 is also supplied to the main control system 22A. The main control system 22A controls the positioning operations of the Y stage 2 to the ZL stage 4 through a drive device 22B, etc. and also controls the operation of the entire apparatus.

As will be described later in detail, a fiducial mark plate 6 is fixed to the vicinity of the wafer 5 on the ZL stage 4 in order to keep the correspondence between a wafer coordinates system defined by the interferometer 13 and a reticle coordinates system defined by the interferometer 14. Various fiducial marks are formed on the fiducial mark plate 6. One of these fiducial mark is a fiducial mark being illuminated from the back thereof by the illuminating light directed to the ZL stage 4 side, i.e., a light-emitting fiducial mark. The construction of the fiducial mark plate 6 and an example of the illumination system therefor are disclosed, for example, in U.S. Pat. No. 4,780,616.

Also, above the reticle 12, there are provided alignment microscopes 19 and 20 for observing therethrough the fiducial marks on the fiducial mark plate 6 and the mark on the reticle 12 at a time. Further, mirrors 15 and 16 for directing detection light from the reticle 12 to the alignment microscopes 19 and 20, respectively, are movably disposed, and when an exposure sequence is started, drive devices 17 and 18 retract the mirrors 15 and 16, respectively, out of the optical path of the exposure light in accordance with a command from the main control system 22A. Further, on the Y-direction side portion of the projection optical system 8, there is disposed an alignment device 34 of the off-axis type for observing therethrough an alignment mark (wafer mark) on the wafer 5. The construction, etc. of the alignment device 34 are disclosed, for example, in U.S. Pat. No. 4,962,318.

Figure 2:
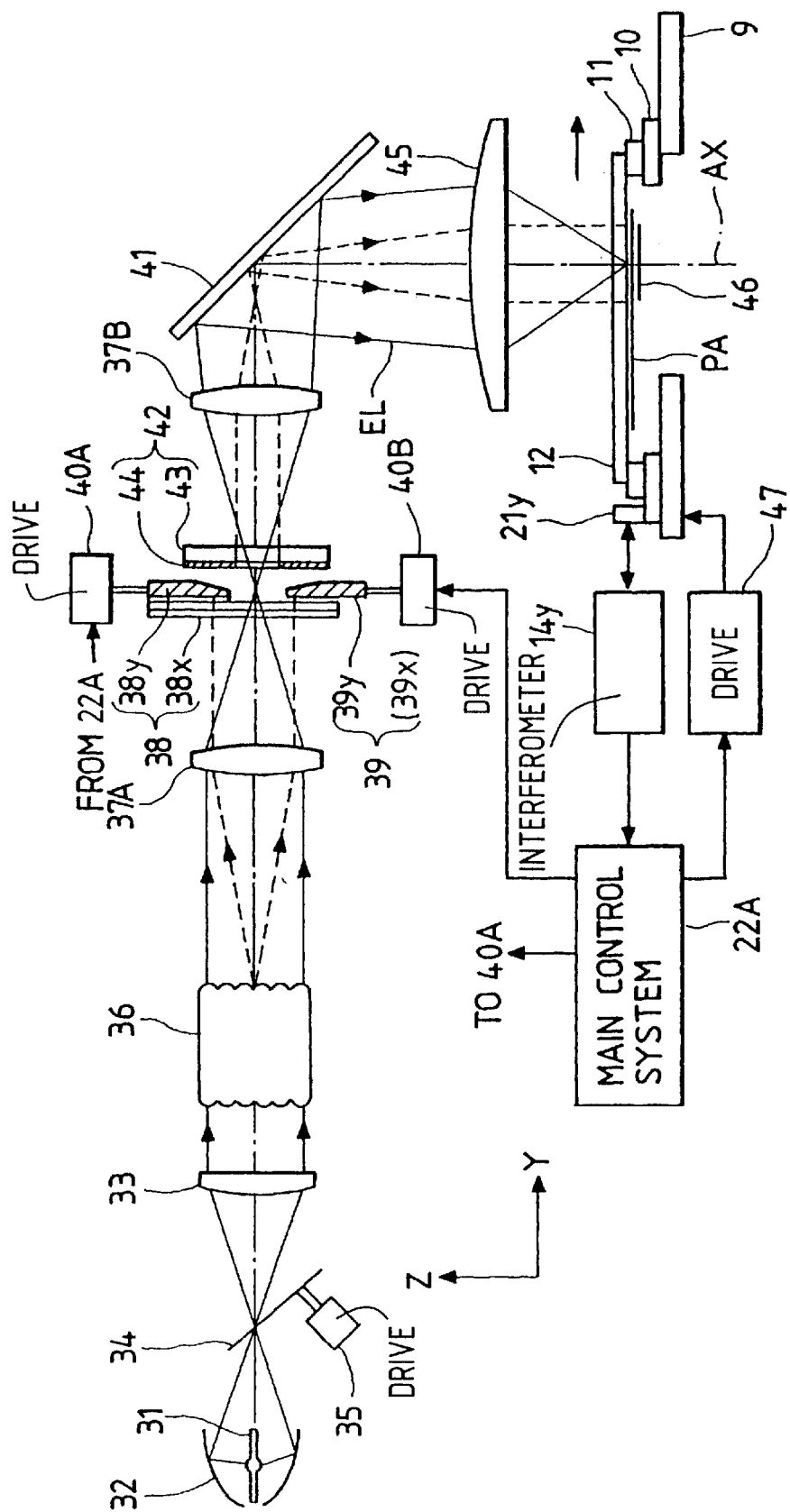
FIG. 2 shows the construction of an illuminating optical system applied to the scanning exposure apparatus of FIG. 1.

FIG. 2 shows an illuminating optical system in the present embodiment. In FIG. 2, exposure light (e.g. i-ray of wavelength 365 nm) from a mercury lamp 31 is condensed on a second focus of an elliptical mirror 32 by this elliptical mirror 32, whereafter it is converted into a substantially parallel beam of light by an input lens 33 and enters a fly-eye lens 36. A shutter 34 is disposed near the second focus of the elliptical mirror 32, and the main control system 22A opens and closes the shutter 34 through a drive device 35 to thereby control exposure time, etc.

A number of secondary light sources are formed on the exit side focal plane of the fly-eye lens 36 (which substantially coincides with the pupil plane of the illuminating optical system), and exposure light EL from these secondary light sources are applied via a first relay lens 37A onto a pair of movable light intercepting plates 38 and 39 with uniform illuminance. The light passed through an aperture portion surrounded by the movable light intercepting plates 38 and 39 reaches a fixed type reticle blind 42 disposed a little apart from the movable light intercepting plates 38 and 39. The fixed type reticle blind 42 is provided by vapor-depositing chromium film 44 on that surface of a glass substrate 43 such as quartz which is adjacent to the movable light intercepting plates 38 and 39 to thereby form a rectangular aperture, and the shape and size (area) of an illumination area on the reticle 12 are determined by an aperture 44a (see FIG. 3) in the chromium film 44. Also, the movable light intercepting plates 38 and 39 are connected to drive devices 40A and 40B, respectively, and during scanning exposure, the main control system 22A effects the position control of the movable light intercepting plates 38 and 39 through the drive devices 40A and 40B.

Figure 3:
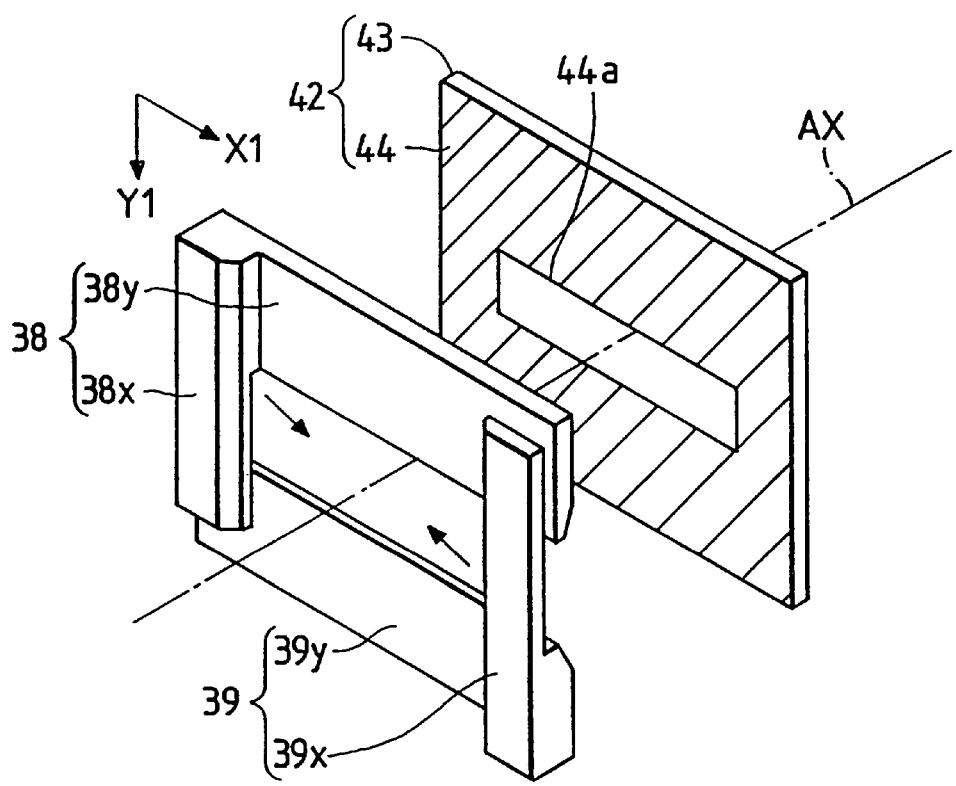
FIG. 3 is a perspective view showing the construction of a movable light intercepting plate and a fixed reticle blind in FIG. 2.

FIG. 3 is an enlarged perspective view of the movable light intercepting plates 38, 39 and the fixed type reticle blind 42. In FIG. 3, a direction corresponding to the scanning direction (Y-direction) of the reticle 12 in FIG. 2 in a plane perpendicular to the optical axis AX of the illuminating optical system is defined as Y1-direction, and a direction corresponding to the non-scanning direction is defined as X1-direction. The movable light intercepting plate 38 is formed by making a vane 38y having an edge perpendicular to Y1-direction and a vane 38x having an edge perpendicular to X1-direction integral with each other. On the other hand, the movable light intercepting plate 39 is formed by making a vane 39y having an edge perpendicular to Y1-direction and a vane 39x having an edge perpendicular to X1-direction integral with each other. The vanes 38y and 39y each having an edge perpendicular to Y1-direction are disposed in the same plane, and likewise, the vanes 38x and 39x each having an edge perpendicular to X1-direction are disposed in the same plane. Further, the vanes 38y, 39y and the vanes 38x, 39x are disposed in deviated relationship in the direction of the optical axis AX so as not to interfere with each other when the movable light intercepting plates 38 and 39 are moved.

Also, the movable light intercepting plates 38 and 39 are supported for movement along X1-direction and Y1-direction, respectively. Also, the illumination area on the reticle 12 of FIG. 2 is limited in Y-direction by an aperture surrounded by the vanes 38y and 39y, and the illumination area on the reticle 12 of FIG. 2 is limited in X-direction by an aperture surrounded by the vanes 38x and 39x. In other words, the illumination area on the reticle 12 defined by the aperture 44a in the fixed type reticle blind 42 has its width (Y-direction) limited by the vanes 38y and 39y, and has its length (X-direction) limited by the vanes 38x and 39x. Now, the light passed through the aperture surrounded by the vanes 38y, 39y and the aperture surrounded by the vanes 38x, 39x enters the fixed type reticle blind 42, and the light passed through the aperture 44a therein irradiates the reticle 12.

Turning back to FIG. 2, the exposure light EL passed through the aperture in the fixed type reticle blind 42 illuminates the illumination area 46 on the reticle 12 with uniform illuminance by way of a second relay lens 37b, a mirror 41 and a main condenser lens 45. Strictly, the illumination area 46 is an area set by the aperture in the fixed type reticle blind 42, and the exposure light EL is applied only to an area in which the illumination area 46 and the illuminated field set by the aperture portion surrounded by the movable light intercepting plates 38 and 39 overlap each other. When scanning exposure is to be effected, the reticle 12 is scanned at a predetermined velocity in Y-direction (the direction parallel to the plane of the drawing sheet of FIG. 2) relative to the illumination area 46.

Also, in the movable light intercepting plates 38 and 39, the vanes 38y and 39y setting the illumination field on the reticle 12 in the scanning direction (Y-direction) are disposed on a plane conjugate with the pattern-formed surface of the reticle 12, and the vanes 38x and 39x setting the illumination field on the reticle 12 in the non-scanning direction (X-direction) are disposed on a plane slightly defocused from that conjugate plane toward the first relay lens 37A side. Also, the fixed type reticle blind 42 (the surface formed with the aperture 44a by the vapor deposition of the chromium film 44) is disposed on a plane defocused by a predetermined distance from the plane conjugate with the pattern-formed surface of the reticle 12 toward the second relay lens 37B side.

Also, during scanning exposure, the position of the reticle 12 in Y-direction is normally detected by a movable mirror 21y for Y-direction on the fine movement stage 11 and an interferometer 14y for Y-direction. The result of this detection is supplied to the main control system 22A, which thus controls the scanning velocity of the coarse movement stage 10 (and further the positions of the fine movement stage 11 in X-, Y- and θ-directions) through a drive portion 47 in conformity with the position of the reticle 12 in Y-direction and the position of the wafer 5 in Y-direction obtained from the interferometer 13.

An example of the scanning exposure operation in the present embodiment will now be described with reference to FIG. 4.

Figure 4:
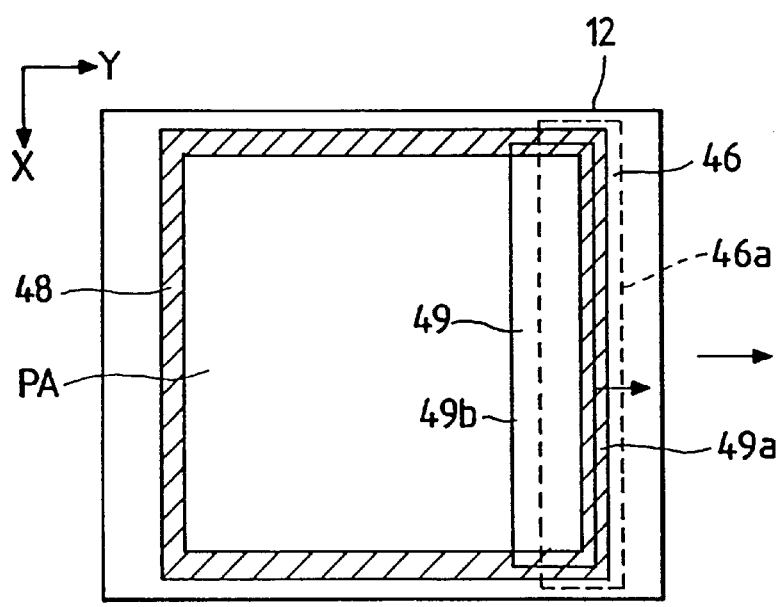
FIG. 4 shows an illumination area and an illumination field on a reticle in FIG. 1.

FIG. 4 shows the construction of the reticle 12 used in the present embodiment, and the image of the pattern in the pattern area PA of the reticle 12 is exposed on the wafer 5. Also, the pattern area PA is surrounded by a light intercepting zone (inhibition zone) 48 of a predetermined width. The exposure light EL is applied to only an area in which the illumination area 46 on the reticle 12 set by the fixed type reticle blind 42 and the illumination field 49 set by the movable light intercepting plates 38 and 39 overlap each other. So, when the scanning of the reticle 12 in Y-direction is to be started, the vane 38y of the movable light intercepting plate 38 is moved in Y1-direction in synchronism with the scanning of the reticle 12 in Y-direction, whereby the edge portion 49a of the illumination field 49 on the scanning direction side is set within the light intercepting zone 48. When the reticle 12 further advances in Y-direction and the edge portion 46a of the illumination area 46 on the scanning direction side comes to the light intercepting zone 48, the vane 38y is greatly moved in Y1-direction to thereby move the edge portion 49a of the illumination field 49 to the outside of the light intercepting zone 48.

At this time, the edge portions on both sides (two sets extending in X-direction) of the illumination field 49 arranged in the scanning direction (Y-direction) are set outside the illumination area 46. On the other hand, the edge portions on both sides (two sets extending in Y-direction) of the illumination field 49 arranged. in the non-scanning direction (X-direction) are set within the light intercepting zone 48, particularly the light intercepting zone extending in Y-direction. Also, the edges on both sides (two sets extending in Y-direction) of the illumination area 46 set by the aperture 44a in the fixed type reticle blind 42 which are arranged in X-direction are set outside the light intercepting zone 48. Accordingly, as long as the illuminated area 46 is set within the pattern area PA, the image of the pattern within a range set in the illumination area 46 in the scanning direction and partitioned by the light intercepting zone 48 in the non-scanning direction is projected onto the wafer 5. Thereafter, during the time from a point of time at which the reticle 12 further advances in Y-direction and the rear edge portion 49b of the illumination field 49 with respect to the scanning direction comes to the light intercepting zone 48 until scanning exposure is terminated, the vane 39y of the movable light intercepting plate 39 is scanned in Y1-direction in synchronism with the scanning of the reticle 12, whereby the edge portion 49b is put into the light intercepting zone 48. Thereby, the exposure light passed through the outside of the light intercepting zone 48 is prevented from being applied onto the wafer 5. The illumination field 49 determined by the movable light intercepting plates 38 and 39 as described above is controlled so as to be always positioned outside the light intercepting zone 48 on the reticle, thereby preventing the illuminating light from leaking out of the light intercepting zone 48 on the reticle 12 even during scanning exposure, particularly immediately after the start, and immediately before the termination, of scanning exposure.

As described above, in the present embodiment, the positioning accuracy of the movable light intercepting plates 38 and 39 for shielding the other area than the pattern area PA on the reticle 12 from the light may be of the order of the width of the light intercepting zone 48 on the reticle 12 and thus, a driving mechanism and a control mechanism can be simplified.

Figure 5A:
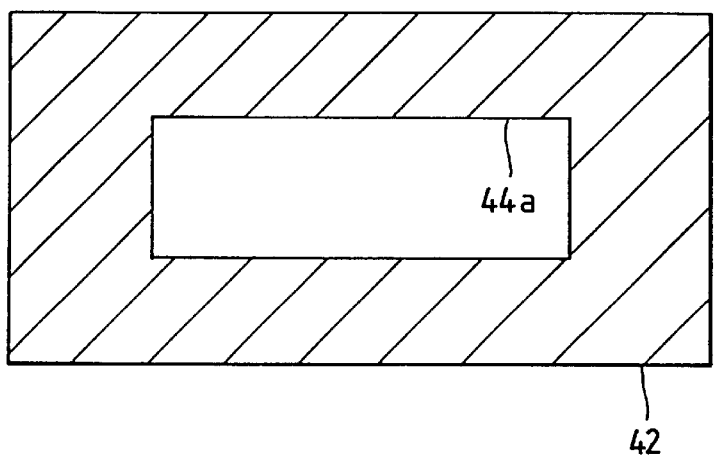
FIG. 5A shows an example of an aperture in the fixed reticle blind.
Figure 5B:
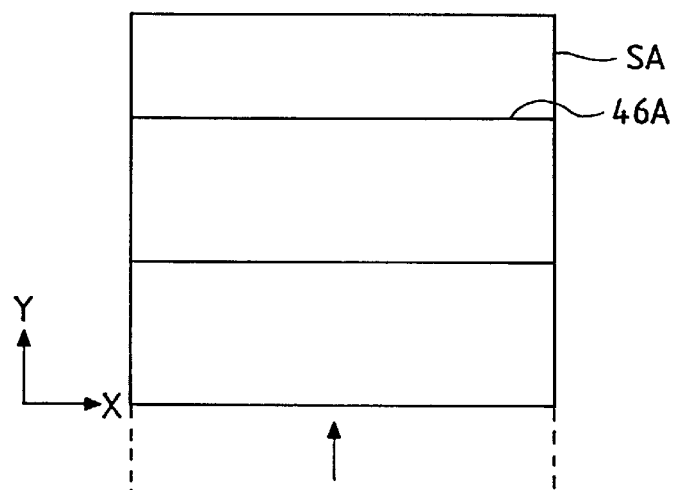
FIG. 5B shows an exposure area on a wafer when the aperture of FIG. 5A is used.
Figure 5C:
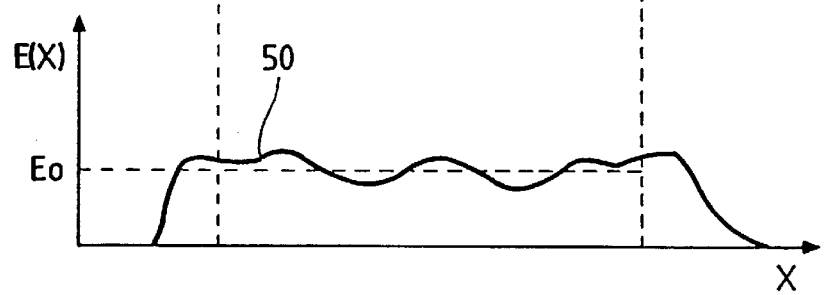
FIG. 5C is a graph showing the integrated exposure amount distribution on the wafer in the non-scanning direction when the aperture of FIG. 5A is used.

Now, assuming in the present embodiment that the intensity of the exposure light EL is constant and the scanning velocities of the reticle 12 and wafer 5 are constant, the integrated exposure amount on the wafer 5 is determined in conformity with the width, in the scanning direction (Y-direction), of the illumination area 46 on the reticle 12 which is set by the fixed type reticle blind 42. In this case, it is considered that in conformity with the optical characteristic or the like of the illuminating optical system, the illuminance distribution on the wafer 5 with respect to X-direction perpendicular to the scanning direction has predetermined irregularity. If as shown, for example, in FIG. 5A, the aperture 44a in the fixed type reticle blind 42 is rectangular, the shot area SA on the wafer 5 is scanned in Y-direction relative to a rectangular exposure area (the projected area of the reticle pattern) conjugate with the aperture 44a, as shown in FIG. 5B. Accordingly, the distribution of the integrated exposure amount E(X) on a straight line on the shot area SA along X-direction (the non-scanning direction) may sometimes become irregular with a predetermined width relative to a target exposure amount $E_0$, as indicated by the distribution curve 50 of FIG. 5C.

Figure 6A:
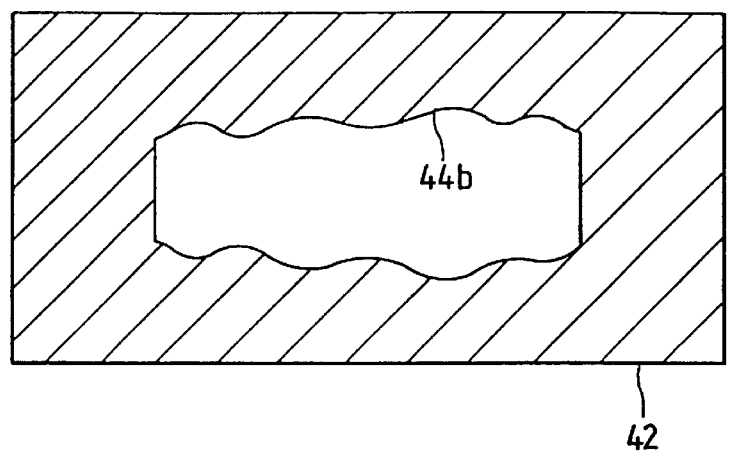
FIG. 6A shows a modification of the aperture in the fixed reticle blind.
Figure 6B:
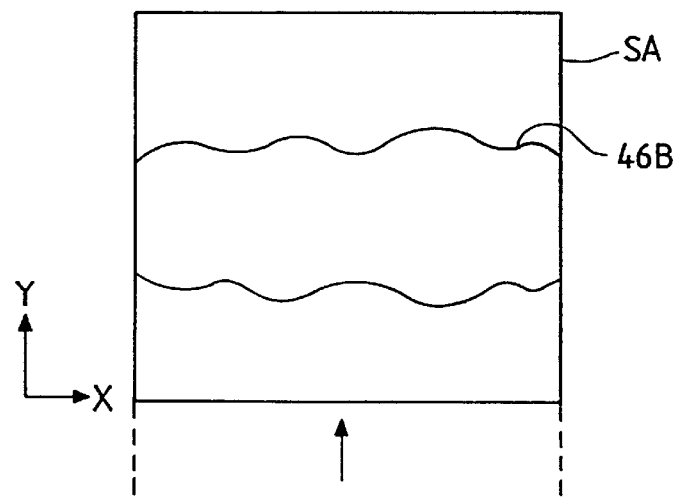
FIG. 6B shows the exposure area on the wafer when the aperture of FIG. 6A is used.
Figure 6C:
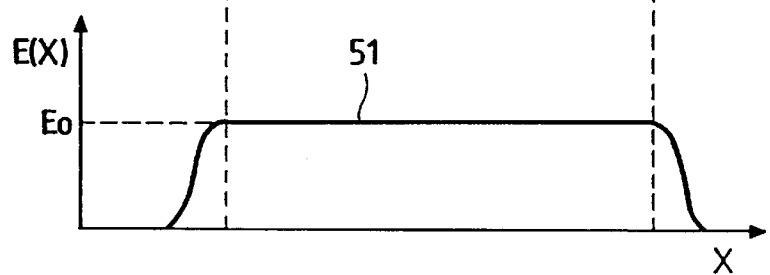
FIG. 6C is a graph showing the integrated exposure amount distribution on the wafer in the non-scanning direction when the aperture of FIG. 6A is used.

In this case, the distribution curve 50 is actually measured for each projection exposure apparatus and as shown in FIG. 6A, the shape of the aperture 44b in the fixed type reticle blind 42 (particularly the distribution of the width in Y1-direction corresponding to the scanning direction (Y-direction)) is determined so as to be substantially inversely proportional to the height of the distribution curve 50. That is, in the portion wherein the value of the distribution curve 50 is great, the width of the aperture 44b is made small, and in the portion wherein the value of the distribution curve 50 is small, the width of the aperture 44b is made great. Here, the shot area SA on the wafer 5 is scanned in Y-direction relative to an exposure area 46B (FIG. 6B) similar in shape to the aperture 44b. Thus, the distribution of the integrated exposure amount E(X) on a straight line on the shot area SA along X-direction (the non-scanning direction) becomes substantially coincident with the target exposure amount $E_0$ over the entire range, as indicated by the distribution curve 51 of FIG. 6C.

As described above, according to the present embodiment, an aperture of a shape determined in conformity with the distribution of the integrated. exposure amount in the non-scanning direction is formed in the fixed type reticle blind 42, and the reticle 12 is scanned relative to the illumination area 46 similar in shape to this aperture and therefore, the distribution of the integrated exposure amount on the wafer 5 in the non-scanning direction is uniformized. Also, in the fixed type reticle blind 42, the shape of the aperture in the chromium film 44 applied to the glass substrate 43 can be highly accurately set to a desired shape and therefore, the distribution of the integrated exposure amount with respect to the non-scanning direction can be uniformized with high accuracy. Also, the both surfaces of the glass substrate 43 of the fixed type reticle blind 42 are spaced apart from the plane conjugate with the pattern-formed surface of the reticle 12 and therefore, the image of a foreign substance (such as dust) adhering to the glass substrate 43 is not defocusedly transferred onto the wafer 5 and moreover, the distribution of the integrated exposure amount is not disturbed.

In the first embodiment, the glass substrate 43 is coated with the chromium film in order to improve the accuracy of the shape of the aperture in the fixed type reticle blind 42. However, it is apparent that if mechanical manufacturing accuracy is improved in the future so that the shape of a knife edge can be formed in conformity with the irregularity of the integrated exposure amount in the non-scanning direction (the irregularity of illuminance), a blind for setting the aperture by a mechanical type knife edge will be usable as the fixed type reticle blind 42.

Also, in the first embodiment, the aperture in the blind is designed in advance to a desired shape, but substantially a similar effect will also be obtained by black-painting the pattern portion on the glass substrate 43 or planing the chromium portion (light intercepting portion) on the glass substrate 43, in conformity with the irregularity of illuminance which can be known by measurement.

Further, in the first embodiment, the fixed type reticle blind 42 and the movable light intercepting plates 38, 39 are disposed apart from each other by a predetermined distance, but alternatively, for example, a relay lens system may be provided in the illuminating optical system to thereby make a plane conjugate with the pattern-formed surface of the reticle, and the fixed type reticle blind 42 and the light intercepting plates 38, 39 may be disposed conjugately with the relay lens system. That is, the fixed type reticle blind and the light intercepting plates need not be disposed in proximity to the vicinity of the same conjugate plane. Also, the light intercepting plates 38 and 39 may be deviated in the direction of the optical axis by a predetermined amount from the plane conjugate with the pattern-formed surface of the reticle.

Figure 7:
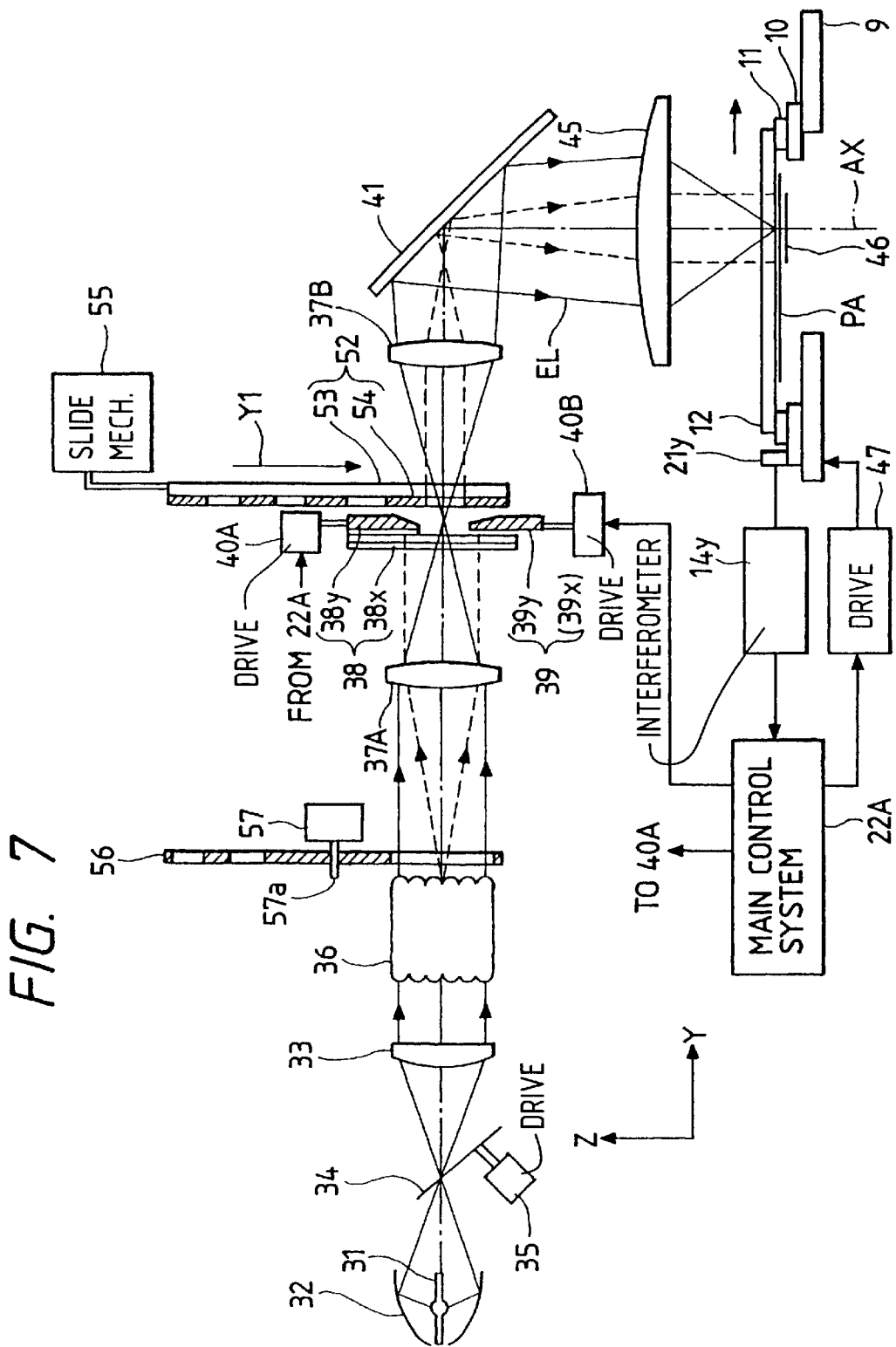
FIG. 7 shows the construction of the illuminating optical system of a scanning exposure apparatus according to a second embodiment of the present invention.

A second embodiment of the present invention will now be described with reference to FIGS. 7 to 9. This embodiment is one in which a part of the illuminating optical system in the first embodiment (FIG. 2) is improved to realize ordinary illumination, zonal illumination and modified illumination in a switching manner. In FIG. 7, portions corresponding to those in FIG. 2 are given the same reference characters and need not be described in detail. Also, the coherence factor (σ value) representative of the degree of coherency of the exposure light is defined by the ratio between the reticle side numerical aperture of the illuminating optical system and the reticle side numerical aperture of the projection optical system, and the illuminating optical system changed over in the present embodiment includes an ordinary optical system, an optical system in which a value is made small, an optical system for the so-called modified light source method (modified illuminating method) and an optical system for the zonal illuminating method. The modified light source method (see Japanese Patent Application Laid-Open No. 4-225514 (U.S. Ser. No. 791,138 filed on Nov. 13, 1991)) is a technique of disposing a plurality of (e.g. four) secondary light sources about the optical axis in the illuminating optical system to thereby improve particularly the resolution during the projection of a line-and-space pattern and widen the depth of focus. Also, the zonal illuminating method (see Japanese Patent Application Laid-Open No. 61-91662) is a technique of bringing about improvements in the resolution and the depth of focus when a predetermined pattern is projected. The zonal light source method and the zonal illuminating method are disclosed, for example, in *SPIE Optical/Laser Microlithography V,* Vol. 1674, 1992.

Again in the present embodiment, the construction of the body portion including the projection optical system 8 is similar to that shown in FIG. 1, but further, a variable aperture stop (not shown) for changing the numerical aperture of the projection optical system 8 is provided on the pupil plane (Fourier transform plane) of the projection optical system 8. The main control system 22A sets the numerical aperture of the projection optical system 8 to a predetermined value through the variable aperture stop in conformity with the pattern or the like of the reticle 12 to be projected, and also effects the changeover of the illuminating optical system.

FIG. 7 shows the illuminating optical system in the present embodiment. In FIG. 7, a variable aperture stop (hereinafter referred to as the filter plate) 56 is disposed on a plane on the exit surface (reticle side surface) of the fly-eye lens 36 which is conjugate with the pupil plane of the projection optical system 8, for rotation about a rotary shaft 57a, and a rotating device 57 is mounted on the rotary shaft 57a. The rotating device 57 rotates the filter plate 56 by a commanded angle of rotation in response to a command from the main control system 22A of FIG. 1.

Figure 9:
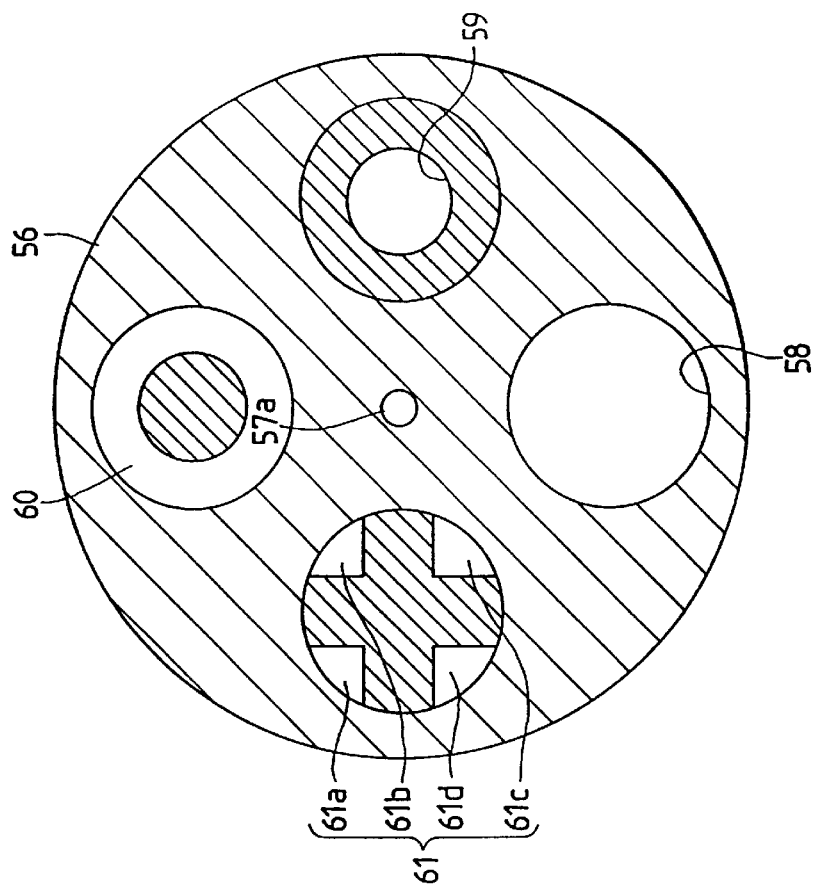
FIG. 9 shows the shapes of apertures in a variable pupil filter plate in FIG. 7.

FIG. 9 shows four kinds of aperture stops provided in the filter plate 56. In FIG. 9, a first circular aperture 58, a second circular aperture 59, a zonal aperture 60 and an aperture 61 for a modified light source comprising four small apertures 61a to 61d are formed in the filter plate 56 comprising a light intercepting disc, at intervals of 90° about the rotary shaft 57a. The first circular aperture 58 sets the aforementioned a value to e.g. σ=0.5 to 0.8. On the other hand, the second circular aperture 59 is used for a phase shift reticle, and sets the a value to e.g. σ=0.1 to 0.4.

In FIG. 7, the rotating device 57 rotates the filter plate 56 to thereby set one of the four kinds of apertures 58 to 61 on the exit surface of the fly-eye lens 36. When the first circular aperture 58 is selected, exposure is effected by the ordinary illuminating method, and when the second circular aperture 59 is selected, exposure is effected with the σ value drawn, and when the zonal aperture 60 is selected, exposure is effected by the zonal illuminating method, and when the aperture 61 for the modified light source is selected, exposure is effected by the modified light source method. Further, in conformity with the illuminating method selected, the diameter (numerical aperture NA) of the variable aperture stop in the projection optical system is also set to a corresponding value.

As described above, in the present embodiment, the illuminating method can be changed over, but when the illuminating method is changed over, the optical paths of the exposure light in the illuminating optical system and the projection optical system 8 also change and therefore, there is the possibility of illuminance irregularities of different tendencies occurring on the exposed surface of the wafer 5 for each illuminating method. That is, even if design is made at all such that illuminance irregularity does not occur in the ordinary illuminating method, there is the possibility of illuminance irregularity occurring when exposure is effected with the ordinary illuminating method changed over to another illuminating method. A technique for avoiding this is to design and manufacture the illuminating optical system and the projection optical system 8 so that illuminance irregularity may not occur even if the optical paths of the exposure light change, but this is very difficult and increases the manufacturing costs of the optical systems.

So, in the present embodiment, the shape of the aperture in the fixed type reticle blind disposed between the movable light intercepting plates 38, 39 and the second relay lens 37B is made changeable in conformity with the illuminating method to thereby prevent the occurrence of illuminance irregularity.

That is, in FIG. 7, a fixed type reticle blind 52 formed with a plurality of apertures is disposed at a predetermined distance from the movable light intercepting plates 38, 39 toward the reticle 12 side, and this fixed type reticle blind 52 is supported so that it can be moved in Y1-direction corresponding to the scanning direction (Y-direction) of the reticle 12 by a slide mechanism 55. The fixed type reticle blind 52 in the present embodiment, like that in the first embodiment (FIG. 6A), is formed with apertures by applying light intercepting film (chromium film) 54 onto a glass substrate 53, and the fixed type reticle blind 52 is formed with four apertures (FIG. 8) correspondingly to the four apertures 58 to 61 of FIG. 9. Also, the surface of the fixed type reticle blind 52 which is coated with the chromium film 54 is disposed on a plane defocused by a predetermined spacing from the plane conjugate with the pattern-formed surface of the reticle 12 toward the second relay lens 37 side.

Figure 8:
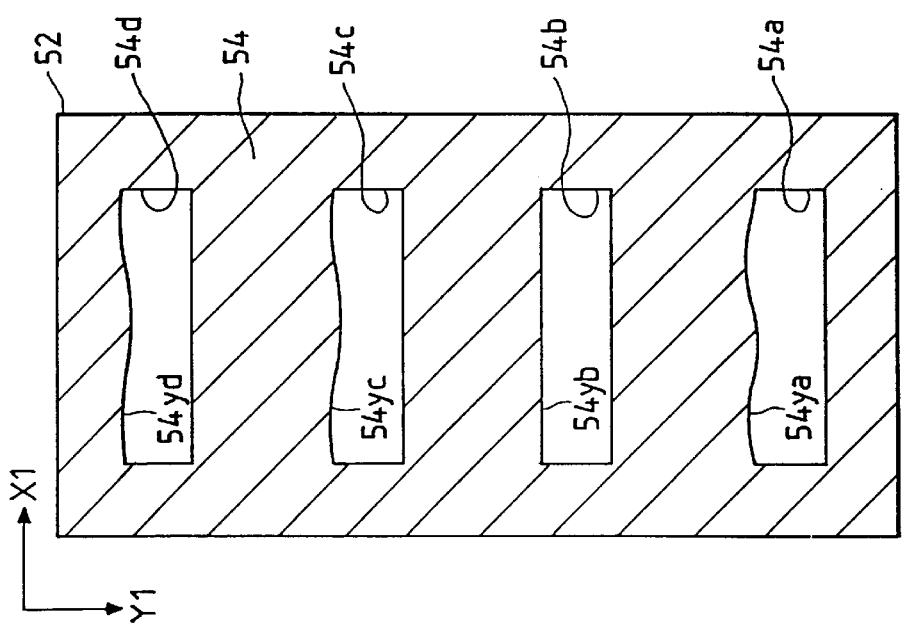
FIG. 8 shows the aperture pattern of a fixed reticle blind in FIG. 7.

FIG. 8 shows an aperture pattern formed in the chromium film 54 of the fixed type reticle blind 52. In FIG. 8, four apertures 54a to 54d are arranged and formed in Y1-direction in the chromium film 54. Each of the four apertures 54a to 54d is of an elongate rectangular shape extending in X1-direction corresponding to the non-scanning direction (X-direction) of the reticle 12, i.e., a direction perpendicular to Y1-direction, and determines the shape and size of the illumination area 46 on the reticle 12. In the other points, the construction of the present embodiment is similar to that of the first embodiment (FIG. 2).

Now, in FIG. 7, the angle of rotation of the filter plate 56 is changed to thereby set one of the four apertures 58 to 61 of FIG. 9 on the exit surface side of the fly-eye lens 36 and in operative association therewith, the fixed type reticle blind 52 is slidden to thereby set one of the four apertures 54a to 54d of FIG. 8 corresponding to the aforementioned one aperture on the vicinity of the reticle side of the movable light intercepting plates 38 and 39. In this case, the distribution of the integrated exposure amount on the wafer 5 in the non-scanning direction (X-direction) when the reticle 12 is scanned with the four kinds of apertures in the filter plate 56 successively set on the exit surface side of the fly-eye lens 36 is measured in advance, for example, by the use of a quantity-of-light sensor on the Z stage 4. The shapes of the edge portions 54ya to 54yd of the apertures 54a to 54d in the fixed type reticle blind 52 which extend in X1-direction (a direction corresponding to the non-scanning direction) are then deformed as shown in FIG. 8 so that the distribution of the integrated exposure amount may become constant.

As described above, according to the present invention, even when any of the ordinary illuminating method, the illuminating method in which σ value is small, the modified light source method and the zonal illuminating method is used, the shapes of the edge portions of the apertures 54a to 54d in the fixed type reticle blind 52 used in each illuminating method are adjusted and therefore, the uniformity of illuminance on the wafer 5 after the pattern image of the reticle 12 is exposed on the wafer 5 by the scanning system becomes good.

It is considered that depending on the illuminating method used, the illuminance (and further the integrated exposure amount) on the wafer 5 may differ. For example, in FIG. 9, as compared with a case where the first circular aperture 58 is used, the illuminance on the wafer 5 may be reduced when the aperture 61 for the modified light source is used. In such a case, when exposure is effected by the modified light source method, it would occur to mind to make the scanning velocities of the reticle 12 and wafer 5 lower than when exposure is effected by the ordinary illuminating method. However, this would reduce the throughput. So, to avoid a great reduction in the throughput, in the fixed type reticle blind 52 of FIG. 8, the average value of the width of the aperture 54d for the modified light source method in Y1-direction can be made greater than the average value of the width of the aperture 54a for the ordinary illuminating method in Y1-direction. Thereby, even when the modified light source method is used, an integrated exposure amount equal to that when the ordinary illuminating method is used on the wafer 5 can be obtained almost without the throughput being reduced and illuminance irregularity does not occur.

Also, in the second embodiment, the shapes of the apertures 58 to 61 formed in the filter plate 56 of FIG. 9 are individually constant, but provision may be made of a mechanism capable of adjusting the diameters, etc. of the apertures 58 to 61. In such case, it is desirable to provide a mechanism capable of changing the widths, in Y1-direction, of the apertures 54a to 54d in the fixed type reticle blind 52 of FIG. 8 and the shapes of the edge portions of these apertures which extend in X1-direction. Specifically to change, for example, the shape, etc. of the aperture 54a, there is a method of forming the aperture by embracing it with two knife edges movable in Y1-direction, or selecting an aperture of a shape most approximate to the required shape from among a number of apertures prepared in advance.

It will be appreciated that in the second embodiment, the filter plate 56 may be characterized as a first optical member which defines an illuminating method to illuminate the mask or, alternatively, as first illumination system portion which changes or adjusts an intensity distribution of the illumination or exposure light in a plane conjugate with the pupil plane of the projection optical system. The fixed type reticle blind 52, on the other hand, may be characterized as a second optical member or second illumination system portion which changes or adjusts a distribution of the integrated exposure amount in the non-scanning direction.

A third embodiment of the present invention will now be described with reference to FIGS. 10 to 15A and 15B. FIG. 10 shows the general construction of a scanning type projection exposure apparatus according to the present embodiment. In FIG. 10, an elongate rectangular illumination area 121 on a reticle R which extends in Y-direction (a direction perpendicular to the plane of the drawing sheet of FIG. 10) is illuminated with uniform illuminance by a pulse light source 101 and an illuminating optical system including a beam shaping optical system 102 to a relay lens 108, and the image of the pattern of the reticle R in the illumination area 121 is transferred onto a wafer W through a projection optical system 113. The pulse light source 101 may be an excimer laser source such as an ArF excimer laser or a KrF excimer laser, or a higher harmonic generating device such as a metal steam laser or a YAG laser.

In FIG. 10, the illuminating light from the pulse light source 101 enters the beam shaping optical system 102 having a cylindrical lens, a beam expander, etc., and has its beam diameter enlarged in the beam shaping optical system and has its aspect ratio changed, and reaches a fly-eye lens 103. A number of secondary light sources are formed on the exit surface of the fly-eye lens 103, and the light from these secondary light sources is condensed by a condenser lens 104 and reaches a movable blind 107 via a fixed field stop (reticle blind) 105. In FIG. 10, the field stop 105 is disposed more adjacent to the condenser lens 104 than to the movable blind 107, but conversely the field stop. 105 may be disposed toward a relay lens system 108.

The field stop 105 is formed with an elongate rectangular aperture, and a beam of light passed through the field stop 105 has its cross-sectional shape made into a rectangle and enters the relay lens system 108. The relay lens system 108 is a lens system for linking the movable blind 107 and the pattern-formed surface of the reticle R together substantially in conjugate relationship. The movable blind 107 is comprised of two vanes (light intercepting plates) 107A and 107B prescribing the width in the scanning direction (X-direction) which will be described later, and two vanes (not shown) prescribing the width in a direction (Y-direction) perpendicular to the scanning direction. Further, the vanes 107A and 107B prescribing the width in the scanning direction are supported so as to be independently movable in the scanning direction by drive portions 106A and 106B, respectively. In the present embodiment, the illuminating light is applied only to an illumination field particularly set by the movable blind 107 within the illumination area 121 on the reticle R set by the fixed field stop 105. The relay lens system 108 is a both-side telecentric optical system, and its telecentricity is maintained in the illumination area 121 on the reticle R.

The reticle R in the present embodiment is placed on a reticle stage 109, and the image of a circuit pattern in the illumination area 121 on the reticle R and in the illumination field defined by the movable blind 107 is projected onto the wafer W through the projection optical system 113. An area on the wafer W which is conjugate with the illumination area 121 with respect to the projection optical system 113 is defined as an exposure area 122. Also, it being understood that in a plane perpendicular to the optical axis AX of the projection optical system 113, the scanning direction of the reticle R for the illuminated area 121 is X-direction (or −X-direction), a direction parallel to the optical axis AX of the projection optical system 113 is defined as Z-direction.

In this case, the reticle stage 109 is driven by a drive portion 110 to thereby move the reticle R at a constant velocity in the scanning direction, and the operations of the drive portions 106A and 106B for the movable blind 107 which is driven in synchronism with the scanning of the reticle R are controlled by a control portion 111. It is a main control system 112 for generally controlling the operation of the entire apparatus that controls the operations of the drive portion 110 and the control portion 111. On the other hand, the wafer W is placed on a wafer stage 114, which is comprised of an XY stage for effecting the positioning of the wafer W in a plane perpendicular to the optical axis AX of the projection optical system 113 and scanning the wafer W in ±X-directions, and a Z stage for effecting the positioning of the wafer W in Z-direction. The main control system 112 controls the positioning operation and scanning operation of the wafer stage 114 through a drive portion 115.

When the projected image of the pattern on the reticle R is to be scan-exposed on each shot area on the wafer W, the reticle stage 109 is driven in +X-direction (or −X-direction) relative to the illumination area 121 set by the field stop 105 to thereby scan the reticle R. Further, in synchronism with this scanning, the wafer stage 114 is driven in −X-direction (or +X-direction) relative to the exposure area 122 conjugate with the illumination area 121 to thereby scan the wafer W. That is, this −X-direction (or X-direction) is the scanning direction of the wafer W. By thus scanning the reticle R and wafer W in synchronism with each other, the projected image of the pattern of the reticle R is transferred onto each shot area on the wafer W.

Now, it is practised to provide a plurality of circuit pattern areas on the reticle R in order to shorten the time required for the interchange of the reticle to thereby improve the throughput. The movable blind 107 is used to select a circuit pattern area to be transferred from among the plurality of circuit pattern areas on the reticle R. So, in the projection exposure apparatus of the present embodiment, provision is made of an input portion 116 for inputting the information regarding the circuit pattern areas on the reticle R, and a memory portion 117 for storing therein the circuit pattern information from the input portion 116, and on the basis of the circuit pattern information in the memory portion 117, the main control system 112 drives the vanes 107A and 107B of the movable blind 107 at a predetermined sequence through the control portion 111 and the drive portions 106A and 106B.

Figure 11A:
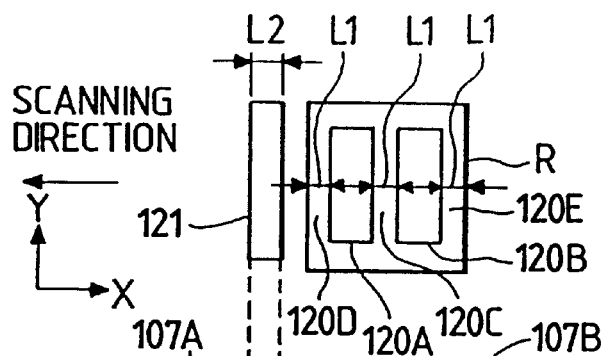

An example of the operation when in the present embodiment, scanning exposure is effected by the step and scan system will now be described with reference to FIGS. 10 and 11A to 11F. As shown in FIG. 11A, two circuit pattern areas 120A and 120B are formed on the reticle R, a light intercepting portion (light intercepting zone) 120C having a width L1 in the scanning direction is formed on the boundary portion between the circuit pattern areas 120A and 120B, and light intercepting portions 120D and 120E each having the same width L1 are also formed outside the circuit pattern areas 120A and 120B as viewed in the scanning direction. Also, in the present embodiment, the illumination area 121 formed on the reticle R is an elongate rectangle having a width L2 in the scanning direction as shown in FIG. 11A, and the width L1 of the light intercepting portions 120C, 120D and 120E is smaller than the width L2 of the illumination area 121.

Now, the operator first inputs the information regarding the circuit pattern areas 120A and 120B on the reticle R to the memory portion 117 through the input portion 116 of FIG. 10. When the pattern image in the first circuit pattern area 120A is to be transferred onto the wafer W through the projection optical system 113, the main control system 112 reads out the information regarding the first circuit pattern area 120A, of the circuit pattern information stored in the memory portion 117, and controls the positions of the vanes 107A and 107B of the movable blind 107 in the scanning direction through the control portion 111 on the basis of this information. Thus, as shown in FIGS. 11B to 11F, the second circuit pattern area 120B on the reticle R is always covered with the vane 107B so that the illuminating light may be applied to only the first circuit pattern area 120A. However, in FIGS. 11A to 11F, the images of the vanes 107A and 107B of the movable blind 107 are actually projected onto the reticle R, and those images are regarded as the vanes 107A and 107B, respectively.

Figure 11B:
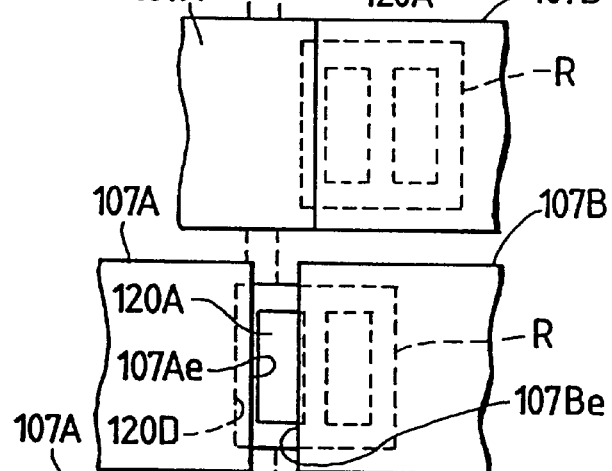

More particularly, the main control system 112 drives the reticle stage 109 through the drive portion 110 and positions the illumination area 121 at the left of the first circuit pattern area 120A on the reticle R as shown in FIG. 11A. Thereafter, it closes the vanes 107A and 107B as shown in FIG. 11B, and positions the boundary portion between the vanes 107A and 107B so as to overlap the light intercepting portion 120D. The main control system then drives the reticle stage 109 to thereby move the reticle R and the vane 107A in −X-direction (the scanning direction) in synchronism with each other as shown in FIG. 11C. As is apparent from FIG. 10, actually the vane 107A is moved in X-direction, but in FIGS. 11A to 11F, the projected image is handled and therefore, the scanning direction of the vanes 107A and 107B is the same as the scanning direction of the reticle R. Also, in the illumination area 121, the pattern in the area between the right edge portion 107Ae of the vane 107A and the left edge portion 107Be of the vane 107B is transferred onto the wafer W.

Figure 11D:
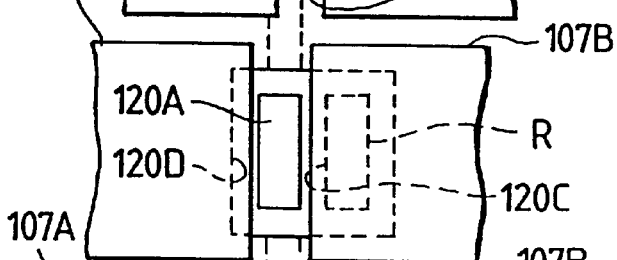
Figure 11E:
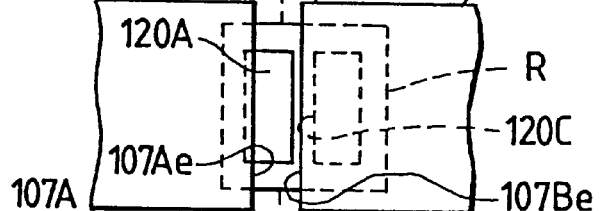

At a point of time whereat as shown in FIG. 11D, the right edge portion 107Ae of the vane 107A goes beyond the left end of the illumination area 121, the vane 107A starts to decelerate. After a point of time at which together with this operation, the light intercepting portion 120C has overlapped the left edge portion 107Be of the vane 107B, the vane 107B is scanned in −X-direction in synchronism with the reticle R as shown in FIG. 11E. At a point of time whereat as shown in FIG. 11F, the pattern area 120A has passed the illumination area 121 and scanning exposure has ended, the deceleration of the reticle R and the vane 107B is started, and at a point of time whereat the reticle R has finally come to a halt, the vanes 107A and 107B become stationary in such a manner as to be closed on the light intercepting portion 120C.

On the other hand, in synchronism with the movement of the reticle R and movable blind 107, the main control system 112 drives the wafer stage 114 through the drive portion 115 to thereby scan the wafer W in the scanning direction (X-direction). Assuming that the projecting magnification of the projection optical system 113 is $M_{RW}$, during scanning exposure, the reticle R is scanned at a velocity $V_{RO}$ in −X-direction (or X-direction) and in synchronism therewith, the wafer W is scanned at a velocity $V_{WO}$ ($=M_{WR} \cdot V_{RO}$) in X-direction (or −X-direction). In this case, the illuminating light is applied to only the first circuit pattern area 120A on the reticle R and therefore, only the pattern image of the first circuit pattern area 120A is transferred onto the wafer W. When the reticle R is to be scanned in X-direction relative to the illumination area 121, the vanes 107A and 107B of the movable blind 107 are controlled in the order of FIGS. 11F, 11E, . . . , 11B.

The relations between the movement velocities of the reticle R and the vanes 107A, 107B shown in FIGS. 11A to 11F will now be described with reference to FIGS. 12A to 12C. The velocity $V_R$ of the reticle R, the velocity $V_{7A}$ of the vane 107A and $V_{7B}$ of the vane 107B are shown in FIGS. 12A, 12B and 12C, respectively. First, correspondingly to the states of FIG. 11B to FIG. 11C, the reticle R and the vane 107A are moved in synchronism with each other as indicated by the period $T_1$ of FIGS. 12A to 12C, and after a period $T_{SE}$, which is required till the velocity $V_R$ becomes stable, scanning exposure is effected during a period $T_2$ for which the velocity $V_R$ of the reticle R is stable. Thereafter, correspondingly to the states of FIG. 11E to FIG. 11F, the reticle R and the vane 107B are moved until stopped in synchronism with each other as indicated by the period $T_3$ of FIGS. 12A to 12C. During this period $T_3$ or the period for which the reticle R is stopped, the wafer W effects stepping in Y-direction and the shot area to the next exposed immediately before the exposure area 122 is positioned.

Figure 11F:
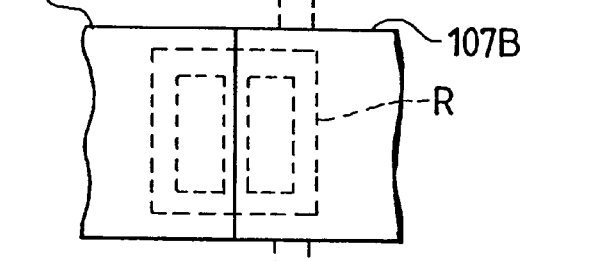

Further, correspondingly to the states of FIG. 11F to FIG. 11E, the reticle R and the vane 107B are moved in synchronism with each other during the period $T_4$ of FIGS. 12A to 12C, and after the period $T_{SE}$, scanning exposure is effected during a period $T_5$ for which the velocity $V_R$ of the reticle R is stable. Thereafter, correspondingly to the states of FIG. 11C to FIG. 11B, the reticle R and the vane 107A are moved until stopped in synchronism with each other as indicated by the period $T_6$ of FIGS. 12A to 12C. Thereafter, this operation is repeated. Also, in FIGS. 12A to 12C, the velocity $V_{7B}$ of the vane 107B during the periods $T_1$ and $T_6$ should only be roughly controlled to such a degree that it substantially comes into the hatched portions 124A and 124B of FIG. 12C, and the velocity $V_{7A}$ of the vane 107A during the periods $T_3$ and $T_4$ should only be roughly controlled to such a degree that it substantially comes into the hatched portions 123A and 123B of FIG. 11B. Accordingly, the control of the vanes 107A and 107B is easy.

Also, when the pattern of the second circuit pattern area 120B on the reticle R of FIG. 11A is to be transferred onto the wafer W, the main control system 112 reads out the information regarding the second circuit pattern area 120B, of the input information stored in the memory portion 117, and on the basis of this information, it controls the positions of the vanes 107A and 107B in the scanning direction through the control portion 111. That is, in a way of thinking similar to that shown in FIGS. 11A to 11F, the vane 107A is made to follow the light intercepting portion 120C at the start of exposure and the vane 107B is made to follow the light intercepting portion 120E at the end of exposure, and the illuminating light is applied to only the second circuit pattern area 120B in such a manner that the first circuit pattern area 120A on the reticle R is covered with the vane 107A. Thereby, only the pattern image of the second circuit pattern area 120B is transferred onto the wafer W.

As described above, according to the present embodiment, the other areas than the circuit pattern area to be exposed are shielded from the light by the vanes 107A and 107B constituting the movable blind 107 and therefore, there is the advantage that even when a plurality of circuit pattern areas are formed on the reticle R at narrow intervals with respect to the scanning direction, only the desired one of those circuit pattern areas can be transferred onto the wafer W. Accordingly, a plurality of circuit pattern areas can be formed on the reticle R at narrow intervals and at high density. Further, as can be seen from FIGS. 11A to 11F, the maximum value of the interval between the vanes 107A and 107B may be of such a degree that it slightly exceeds the width of the area conjugate with the illumination area 121, and the movement stroke of the vanes 107A and 107B may also be of such a degree that it slightly exceeds the width of the area conjugate with the illumination area. This leads to the advantage that the shape of the movable blind 107 may be small.

Figure 13A:
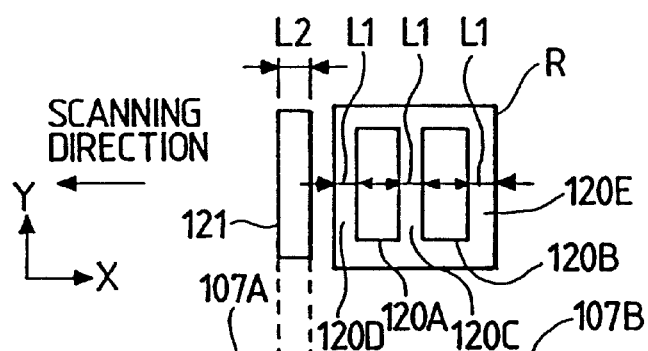
FIGS. 13A to 13F are views used to illustrate another example of the scanning exposing operation of the third embodiment.
Figure 13B:
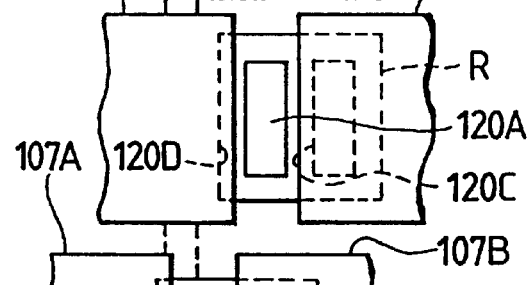
Figure 13C:
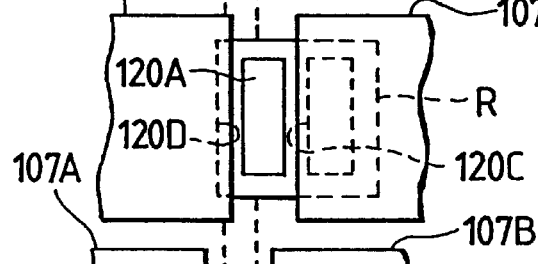
Figure 13D:
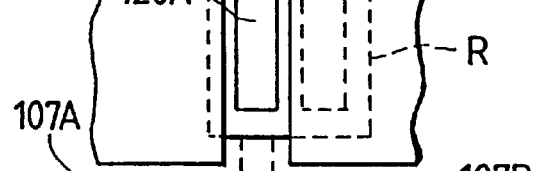
Figure 13E:
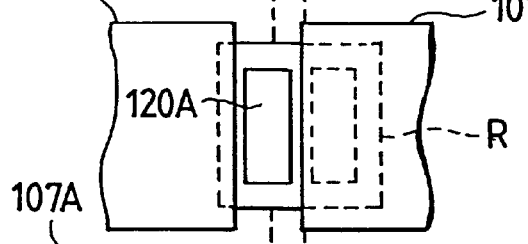
Figure 13F:
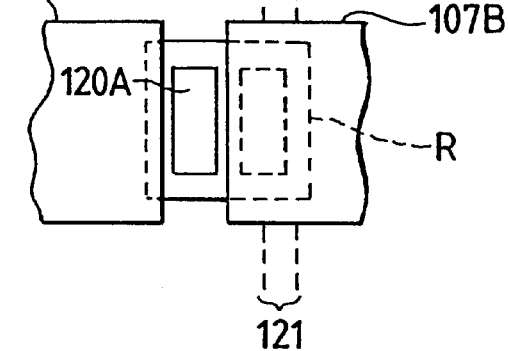

Another example of the operation when scanning exposure is effected by the step and scan system will now be described with reference to FIGS. 10 and 13A to 13F. Again in this example, the reticle R to be exposed, as shown in FIG. 13A, is provided with two circuit pattern areas 120A and 120B, like the reticle of FIG. 11A, but the control method for the vanes 107A and 107B of the movable blind 107 differs from the case of FIGS. 11A to 11F. In the present example, before the start of exposure, as shown in FIGS. 13B to 13F, the edge portions of the vanes 107A and 107B (actually the projected images of these) are set in the light intercepting portions 120D and 120C, respectively, and subsequently the reticle stage 109 is driven to move the reticle R and the vanes 107A, 107B in synchronism with each other in −X-direction which is the scanning direction. Also, in synchronism therewith, the wafer W is moved in the scanning direction (X-direction).

Again in this case, the illuminating light is applied to only the first circuit pattern area 120A on the reticle R and therefore, only the image of the first circuit pattern area 120A is transferred onto the wafer W. When scanning is to be effected in the opposite direction, the vanes 107A and 107B of the movable blind 107 are scanned in the order of FIGS. 13F, 13E, . . . , 13B. The control method shown in FIGS. 13A to 13F has the advantage that acceleration and deceleration control may be the same, but the interval between the vanes 107A and 107B need be equal to or greater than the width of the first circuit pattern area 120A and the movement stroke of the vanes 107A and 107B becomes long and thus, the movable blind 107 becomes bulky. The control accuracy of the position of the movable blind 107 shown in FIGS. 11A to 11F and FIGS. 13A to 13F can be within the width L1 of the light intercepting portions 120C, 120D and 120E, and may be rough as compared with the control accuracy of the position of the reticle R.

Also, in FIGS. 11A to 11F and FIGS. 13A to 13F, the vane (light intercepting plate) in Y-direction (the non-scanning direction) which is a vertical direction in the plane of the drawing sheet orthogonal to the scanning direction (X-direction) is not shown, but yet the aperture portion formed by this vane in the non-scanning direction may be fixed during scanning exposure. This is apparent from the first embodiment. Also, the edge portion of the cross-sectional shape of the illuminance distribution of the illumination area 121 in the non-scanning direction, as in the scanning direction, has a slope by the field stop 105 being deviated from the conjugate position with the reticle R, and the cross-sectional shape thereof is a trapezoidal shape (since the length in the non-scanning direction is sufficient, it is to be understood that blur does not occur until the cross-sectional shape becomes a triangular shape). Therefore, it is desirable that the illumination field between the light intercepting portions in the non-scanning direction on the reticle R be set in a portion in the illumination area 121 wherein the illuminance distribution is flat in the non-scanning direction. This is because the slope of the edge in the scanning direction is integrated by scanning exposure and does not contribute to the uniformity of illuminance, while the slope of the edge in the non-scanning direction intactly contributes to the uniformity of illuminance.

In this case, the substantial shape of the illumination area 121 on the reticle R is defined in the scanning direction by the field stop 105 and in the non-scanning direction by the movable blind 107. While the movable blind 107 is constructed so that two vanes in the scanning direction and two vanes in the non-scanning direction, thus four vanes in total can be independently driven, the movable blind 107 may be constructed as in FIG. 3 so that two L-shaped vanes can be independently driven in X- and Y-directions. Further, in FIGS. 11A to 11F and FIGS. 13A to 13F, the width L2 of the illumination area 121 is greater than the width L1 of the light intercepting portions 120C, 120D and 120E, but if the width L1 of the light intercepting portions 120C, 120D and 120E can be made greater than the width L2 plus the amount of movement of the reticle during the acceleration and deceleration thereof, the movable blind 107 in the scanning direction could be eliminated. In this case, the movable blind 107 will be constructed of only the vanes for the non-scanning direction.

Reference is now had to describe an example of the operation when the movable blind 107 is constructed of two vanes 107A and 107B movable in the scanning direction (X-direction) and two vanes 107C and 107D movable in the non-scanning direction (Y-direction), thus four vanes in total. In this case, even if a plurality of circuit pattern areas are formed on the reticle R in the non-scanning direction (Y-direction), only a desired circuit pattern area could be transferred onto the wafer W. That is, where for example, four circuit pattern areas 120F to 120I are formed on the reticle R separately in X-direction and Y-direction, the illuminating light can be applied to only one of the four circuit pattern areas 120F to 120I by independently adjusting the positions of the four vanes 107A to 107D. The reticle R and the vanes 107A to 107D are then scanned in X-direction relative to the illumination area 121 by the method of FIGS. 11A to 11F or FIGS. 13A to 13F, whereby only a selected circuit pattern area on the reticle R is transferred onto the wafer W.

Figure 15A:
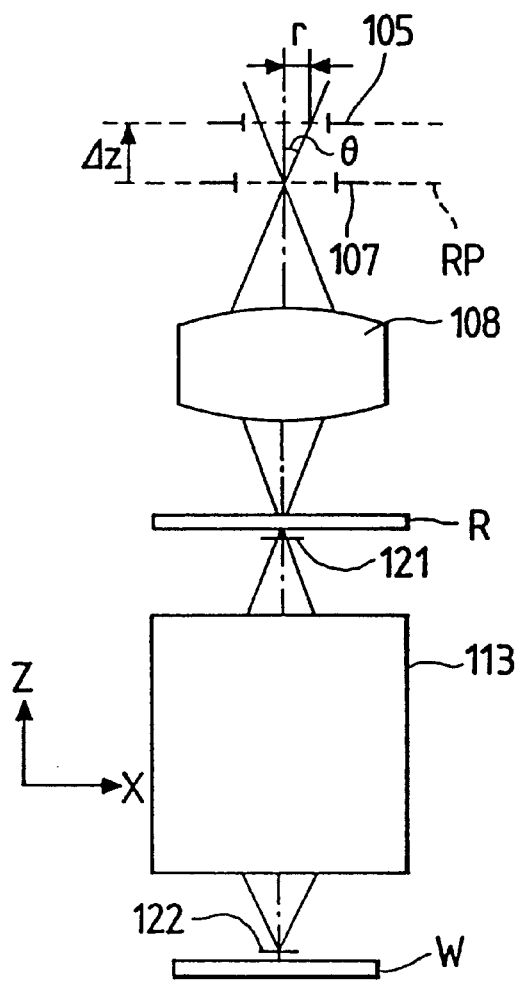
FIG. 15A is a schematic view of the optical system from a fixed field stop.

Now, in the present embodiment, in FIG. 10, the plane on which the fixed field stop 105 is disposed deviates in the direction of the optical axis (Z-direction) from a plane RP conjugate with the pattern-formed surface of the reticle R. With the amount of this deviation being Δz, the condition of the amount of deviation Δz is found with reference to FIGS. 15A and 15B. FIG. 15A shows the optical system from the field stop 105 to the wafer W in a simplifying manner. In FIG. 15A, it is to be understood that the projecting magnification of the relay lens system 108 is $M_{BR}$, the projecting magnification of the projection optical system 113 is $M_{RW}$, the wafer side numerical aperture of the projection optical system 113 is $NA_W$ and the coherence factor indicative of the degree of the coherency of the illuminating light from the illuminating optical system is σ. At this time, the light beam angle θ of the illuminating light converged at a point on the reticle R and the wafer W on the disposition plane (conjugate plane RP) of the movable blind is as follows:

$$\theta = \arcsin(M_{BR} \cdot M_{RW} \cdot NA_W \cdot \sigma) \qquad (2)$$

Also, the radius r of the blur of the illuminating light on the disposition plane of the fixed field stop 105 spaced apart by Δz in the direction of the optical axis from the conjugate plane RP is as follows:

$$r = \Delta z \cdot \tan\theta = \Delta z \cdot \tan\{\arcsin(M_{BR} \cdot M_{RW} \cdot NA_W \cdot \sigma)\} \qquad (3)$$

Also, the radius ΔD of the blur of the illuminating light emitted from a point on the disposition plane of the fixed field stop 105 on the exposed surface (for example, the front surface) of the wafer W is expressed as follows:

$$\Delta D = r \cdot M_{BR} \cdot M_{RW} \qquad (4)$$

Accordingly, the following equation is established from equations (3) and (4):

$$\Delta z = \Delta D / [M_{BR} \cdot M_{RW} \cdot \tan\{\arcsin(M_{BR} \cdot M_{RW} \cdot NA_W \cdot \sigma)\}] \qquad (5)$$

When the allowable minimum value of the radius of the blur on the exposed surface of the wafer W formed by the illuminating light emitted from a point on the disposition plane of the fixed field stop 105 is ΔDmin, the amount of deviation (defocus amount) Δz of the fixed field stop 105 in the direction of the optical axis can be set so as to satisfy the following condition:

$$|\Delta z| \geq \Delta D\min/[M_{BR} \cdot M_{RW} \cdot \tan\{\arcsin(M_{BR} \cdot M_{RW} \cdot NA_W \cdot \sigma)\}] \qquad (6)$$

Figure 15B:
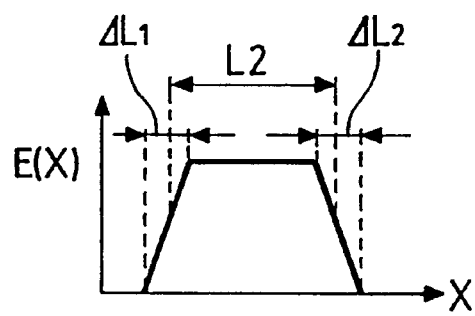
FIG. 15B is a graph showing the illuminance distribution of the illuminated area on the reticle in the scanning direction.

Also, the allowable minimum value ΔDmin of the radius of the blur in equation (6) is determined by the irregularity or the like of the exposure energy during each pulse light emission of the pulse light source 101. By the position of the fixed field stop 105 being thus deviated by Δz in the direction of the optical axis from the conjugate plane RP with the reticle R, the illuminance distribution E(X) of the illumination area 121 on the reticle R in the scanning direction (X-direction), as shown in FIG. 15B, becomes a trapezoidal shape in which the edge portions in the scanning direction have widths $\Delta L_1$ and $\Delta L_2$, respectively (in the example shown in FIG. 15B, $\Delta L_2 = \Delta L_1$). In this case, the interval between positions at which the value of the illuminance distribution E(X) becomes ½ of the maximum value, i.e., the half value width $L_2$, is the width of the illumination area 121 in the scanning direction. Where a continuous light source such as a mercury lamp is used in lieu of the pulse light source 101, the allowable minimum value ΔDmin of the radius of the blur becomes very small and the amount of deviation Δz may be approximately 0.

While in the present embodiment, the shape of the illumination area 121, i.e., the shape of the aperture in the field stop 105, has been described as a rectangle, the shape of the aperture is not limited to a rectangle, but the illumination area may be, for example, the hexagonal illumination area disclosed in U.S. Pat. No. 3,538,828, the diamond-shaped illumination area disclosed in Japanese Patent Publication No. 53-25790 or U.S. Pat. No. 4,239,379, or the arcuate illumination area disclosed in U.S. Pat. No. 4,682,885. This also holds true in the first and second embodiments. Also, the pulse light source 101 is used as the exposure light source, but the present embodiment may also be intactly applied to a case where a continuous light source such as a mercury lamp is used as the exposure light source.

Also, in each of the above-described embodiments, the variable field stop (38, 39; 107) for varying the width of the aperture in operative association with the scanning of the reticle is comprised of a plurality of movable blades, but for example, the field stop may be constructed of a liquid crystal display device or an electrochromic device and the width of the aperture therein may be sequentially varied in the same manner as previously described. Also, the field stop (42; 52; 105) for prescribing the illumination area on the reticle may be constructed of a liquid crystal display device or an electrochromic device. Further, the projection optical system used in each of the above-described embodiments may be any of a refracting system, a reflecting system and a catadioptric system. The present invention is not restricted to a projection exposure apparatus, but is also applicable to an exposure apparatus of the contact type or the proximity type. Thus, the present invention is not restricted to the above-described embodiments, but can assume various constructions without departing from the gist of the invention.

What is claimed is:

1. A scanning exposure apparatus comprising:
   means for synchronously scanning a mask and a substrate in respective scanning directions;
   a projection system disposed between the mask and the substrate;
   means for changing an intensity distribution of illumination light illuminated to said mask, on a plane which is substantially conjugate with a pupil plane of the projection optical system; and
   means for adjusting a distribution of an integrated exposure amount in a direction perpendicular to the scanning direction of the substrate, in accordance with a change in said intensity distribution.

2. A projection exposure apparatus comprising:
   a projection optical system which projects a pattern formed in a transfer area on a mask onto a photosensitive substrate;
   a device which scans said mask and said photosensitive substrate relative to each other along a direction substantially perpendicular to the optical axis of said projection optical system to transfer the pattern of said mask to said photosensitive substrate;
   an illumination optical system which applies illuminating light to the transfer area of said mask through an aperture in a field stop disposed apart from a plane conjugate with a pattern surface of said mask;
   a light shielding member disposed in a plane substantially conjugate with the pattern surface of said mask to shield at least a part of an illumination area on said mask which is defined by the aperture in said field stop from the light; and;
   a member which drives said light shielding member in operative association with a change in the position of said illumination area on the transfer area of said mask which is changed by said relative scanning,
   wherein when the numerical aperture of said photosensitive substrate side of said projection optical system is $NA_W$ and the coherence factor of said illuminatin optical is σ and the projecting magnification of said projection optical system is $M_{RW}$ and the magnification of an optical system disposed between the plane conjugate with the pattern surface of said mask near the disposition plane of said field stop and the pettern surface of said mask is $M_{BR}$ and the allowable minimum value of the radius of blur, on said photosensitive substrate, of the light emitted from a point on the disposition plane of said field stop is ΔDmin, the interval Δz between the disposition plane of said field stop and the plane conjugate with the pattern surface of said mask in the direction of the optical axis of said illumination optical system satisfies the following relation:

$$|\Delta z| \geq z \Delta D \min / [M_{BR} \cdot M_{RW} \cdot \tan\{\text{arc } \sin(M_{BR} \cdot NA_W \cdot \sigma)\}].$$

3. An apparatus according to claim 2, wherein said illuminating optical system includes a pulse light source generating pulse light as said illuminating light.

4. An apparatus according to claim 3, wherein said pulse light source is an excimer laser source.

5. A scanning exposure apparatus comprising:
   a projection optical system which projects an image of a pattern formed in a transfer area on a mask onto a photosensitive substrate;
   a device which moves said mask and said photosensitive substrate relative to each other in a direction substantially perpendicular to the optical axis of said projection optical system to transfer the pattern of said mask to said photosensitive substrate;
   an illumination optical system which applies illuminating light to the transfer area of said mask through an aperture in a field stop disposed apart from a plane conjugate with a pattern surface of said mask;
   a light shielding member disposed in a plane substantially conjugate with the pattern surface of said mask to shield at least a part of an illumination area on said mask which is defined by the aperture in said field stop;
   a member which drives said light shielding member in operative association with a change in the position of said mask;

a first optical member which changes the intensity distribution of the illuminating light on a plane which is substantially conjugate with a pupil plane of the projection optical system; and a second optical member which varies the shape of the aperture in said field stop in accordance with said intensity distribution changed by the first optical member.

6. A scanning exposure apparatus which transfers a pattern on a mask onto a substrate through a projection optical system while the mask and the substrate are moved synchronously in respective scanning directions, the apparatus comprising:

an illumination system, disposed along an optical path of illumination light, which directs the illumination light to the mask;

an optical integrator disposed in the illumination system;

a first optical member, disposed in the illumination system, which defines an illuminating method to illuminate the mask with the illumination light based on the pattern, wherein the optical path of said illumination light in said projection optical system is changed in accordance with a change of the illuminating method; and a second optical member, disposed in the illumination system, which adjusts a distribution of an integrated exposure amount in a direction perpendicular to the scanning direction of the substrate, in accordance with the illuminating method defined by said first optical member.

7. An apparatus according to claim 6, wherein said first optical member defines an intensity distribution of said illumination light on a plane which is substantially conjugate with the pupil plane of said projection optical system in order to define the illuminating method.

8. An apparatus according to claim 7, wherein said first optical member includes an aperture stop, and said intensity distribution of said illumination light on the plane substantially conjugate with the pupil plane of said-projection optical system is defined by an aperture of said aperture stop.

9. An apparatus according to claim 7, wherein said first optical member makes an intensity of a center of said illumination light to be lower than an intensity of an outside thereof.

10. An apparatus according to claim 6, wherein said second optical member is disposed apart from the plane substantially conjugate with the pattern surface of said mask.

11. An apparatus according to claim 6, wherein said second optical member changes a shape of an illumination area of said illumination light in order to adjust the distribution of the integrated exposure amount.

12. An apparatus according to claim 11, wherein said first optical member is capable of defining a plurality kinds of illuminating methods, and said second optical member has a plurality of openings which differ from each other in shape and which define sectional shapes of said illumination light correspondingly to the illuminating methods, respectively.

13. An apparatus according to claim 6, wherein said substrate and said illumination light are moved relatively for a scanning exposure.

14. An apparatus according to claim 6, wherein said optical integrator includes a fly-eye lens system.

15. A scanning exposure apparatus which transfers a pattern on a mask onto a substrate by synchronously moving said mask and said substrate relative to illumination light, the apparatus comprising:

a field stop, disposed apart from a plane conjugate with a pattern surface of said mask, which defines a shape of an illumination area of said illumination light on the pattern surface of said mask;

a relay optical system which is disposed between the plane conjugate with the pattern surface of said mask near the disposition plane of said field stop and said mask; and a projection optical system disposed between said mask and said substrate;

wherein when the numerical aperture of a substrate side of said projection optical system is $NA_W$ and the coherence factor of said illumination light is $\sigma$ and the projecting magnification of said projection optical system is $M_{RW}$ and the magnification of said relay optical system is $M_{BR}$ and the allowable minimum value of the radius of blur, on said substrate, of the light emitted from a point on the disposition plane of said field stop is $\Delta D\min$, the interval $\Delta z$ between the disposition plane of said field stop and the plane conjugate with the pattern surface of said mask satisfies the following relation:

$$|\Delta z| \geq z \Delta D\min / [M_{BR} \cdot M_{RW} \cdot \tan\{\arc\sin(M_{BR} \cdot NA_W \cdot \sigma)\}].$$

16. A scanning exposure apparatus which transfers a pattern on a mask onto a substrate through a projection optical system while the mask and the substrate are moved synchronously in respective scanning directions, the apparatus comprising:

an illumination system, disposed along an optical path of illumination light, which directs the illumination light to the mask;

an optical integrator disposed in the illumination system;

a first illumination system portion, disposed in the illumination system, which changes an intensity distribution of said illumination light on a plane which is substantially conjugate with a pupil plane of the projection optical system, based on the pattern; and a second illumination system portion, disposed in the illumination system, which changes a distribution of an integrated exposure amount in a direction perpendicular to the scanning direction of the substrate, in accordance with the intensity distribution changed by said first illumination system portion.

17. An apparatus according to claim 16, wherein said second illumination system portion has a plurality of openings which differ from each other in shape, and said second illumination system portion changes the distribution of the integrated exposure amount by disposing one of the plurality of openings in an optical path of said illumination light.

18. An apparatus according to claim 17, wherein said first illumination system portion has a plurality of aperture stops which differ from each other, and said first illumination system portion changes the intensity distribution of said illumination light on the plane which is substantially conjugate with the pupil plane of the projection optical system by disposing one of the aperture stops in the optical path of said illumination light.

19. An apparatus according to claim 18, wherein said plurality of aperture stops differ from each other in at least one of shape, size and positional relationship between light transmitting portion and light intercepting portion.

20. An apparatus according to claim 17, wherein the plurality of openings are respectively formed by coating a light intercepting film on a transparent member.

21. An apparatus according to claim 16, wherein said second illumination system portion includes a field stop.

22. An apparatus according to claim 21, wherein said field stop is disposed apart from a plane conjugate with the pattern surface of said mask.

23. An apparatus according to claim 16, wherein said first illumination system portion makes an intensity of a center of said illumination light to be lower than an intensity of an outside thereof.

24. An apparatus according to claim 16, wherein a numerical aperture of said projection optical system is set in accordance with an intensity distribution of the illumination light changed by said first illumination system portion.

25. An apparatus according to claim 16, wherein said second illumination system portion changes an illumination area of said illumination light on said mask in order to adjust the distribution of the integrated exposure amount.

26. An apparatus according to claim 16, wherein said second illumination system portion includes a field stop which has an aperture for passing said illumination light, and said changing of the integrated exposure amount distribution is performed by changing the aperture of said field stop.

27. An apparatus according to claim 25, wherein said changing of the illumination area includes a change in a shape thereof.

28. An apparatus according to claim 25, wherein said changing of the illumination area includes a change in a size thereof.

29. An apparatus according to claim 16, wherein said optical integrator includes a fly-eye lens system.

30. A scanning exposure method, comprising:
   changing an intensity distribution of illumination light illuminated to a mask, on a plane which is substantially conjugate with a pupil plane of a projection system which projects an image of a pattern formed on said mask; and
   adjusting a shape of an illumination area of the illumination light illuminated to said mask, in accordance with the changed intensity distribution on the plane which is substantially conjugate with the pupil plane of the projection system.

31. A scanning exposure method in which a pattern on a mask is transferred onto a substrate by synchronously moving said mask and said substrate relative to illumination light, said method comprising:
   changing an intensity distribution of illumination light illuminated to a mask, on a plane which is substantially conjugate with a pupil plane of a projection system which projects an image of a pattern formed on said mask; and
   adjusting a size of an illumination area of the illumination light illuminated to said mask, in accordance with the changed intensity distribution on the plane which is substantially conjugate with the pupil plane of the projection system.

32. A method according to claim 31, wherein the adjusting of the size of said illumination area includes adjusting the width of said illumination area in a direction. along which said mask is moved.

33. A scanning exposure method in which a pattern on a mask is transferred onto a substrate through a projection optical system while the mask and the substrate are moved synchronously in respective scanning directions, said method comprising:
   determining an illuminating method to illuminate said mask with illumination light based on the pattern, wherein an optical path of said illumination light in said projection optical system is changed in accordance with a change of the illuminating method; and
   adjusting a distribution of an integrated exposure amount in a direction perpendicular to the scanning direction of the substrate, in accordance with the determined illuminating method.

34. A method according to claim 33, wherein said illuminating method includes a zonal illuminating method.

35. A method according to claim 33, wherein said illuminating method includes a modified light source method.

36. A method according to claim 33, wherein a numerical aperture of said projection optical system is set in accordance with said determined illuminating method.

37. A method according to claim 33, wherein said distribution of the integrated exposure amount is adjusted by changing a shape of an illumination area of said illumination light.

38. A method according to claim 33, wherein said substrate and said illumination light are moved relatively for a scanning exposure.

39. A scanning exposure method in which a pattern on a mask is transferred onto a substrate through a projection optical system while the mask and the substrate are moved synchronously in respective scanning directions, said method comprising:
   changing an intensity distribution of exposure light on a plane which is substantially conjugate with a pupil plane of the projection optical system; and
   adjusting a distribution of an integrated exposure amount in a direction perpendicular to the scanning direction of the substrate, in accordance with the change in the intensity distribution on the plane which is substantially conjugate with the pupil plane of the projection optical system.

40. A method according to claim 39, wherein the adjusting of the integrated exposure amount distribution is performed by changing a field stop.

41. A method according to claim 39, wherein the changing of the intensity distribution of said light on the plane which is substantially conjugate with the pupil plane of the projection optical system is performed by changing an aperture stop.

42. A method according to claim 39, wherein said adjusting of the integrated exposure amount distribution includes a change in a shape of an illumination area of said light.

43. A method according to claim 39, wherein said adjusting of the integrated exposure amount distribution includes a change in a size of an illumination area of said light.

44. A method for making an exposure apparatus in which a pattern formed on a mask is transferred onto a substrate through a projection system while the mask and the substrate are moved synchronously in respective scanning directions, said method comprising:
   providing an illumination system, disposed along an optical path of illumination light, which directs the illumination light to the mask;
   providing an optical integrator disposed in the illumination system;
   providing a first illumination system portion, disposed in the illumination system, which changes an intensity distribution of said illumination light on a plane which is substantially conjugate with a pupil plane of the projection optical system; and
   providing a second illumination system portion, disposed in the illumination system, which adjusts a distribution of an integrated exposure amount in a direction perpendicular to the scanning direction of the substrate, in accordance with the intensity distribution changed by said first illumination system portion.

45. A method according to claim 44, wherein said second illumination system portion has a plurality of openings which differ from each other in shape, and said second illumination system portion adjusts the integrated exposure amount distribution by disposing one of the plurality of openings in an optical path of said illumination light.

46. A method according to claim 44, wherein said second illumination system portion includes a field stop.

47. A method according to claim 46, wherein said field stop has a slit-shaped aperture.

48. A method according to claim 46, wherein said field stop is disposed apart from a plane conjugate with the pattern surface of said mask.

49. A method according to claim 44, wherein said first illumination system portion makes an intensity of a center of said illumination light to be lower than an intensity of an outside thereof.

50. A method according to claim 44, wherein a numerical aperture of said projection system is set in accordance with an intensity distribution of the illumination light changed by said first illumination system portion.

* * * * *